US006469423B2

(12) United States Patent
Nagai

(10) Patent No.: US 6,469,423 B2
(45) Date of Patent: *Oct. 22, 2002

(54) RECTANGULAR AT-CUT QUARTZ ELEMENT, QUARTZ RESONATOR, QUARTZ RESONATOR UNIT AND QUARTZ OSCILLATOR, AND METHOD OF PRODUCING QUARTZ ELEMENT

(75) Inventor: Itaru Nagai, Nagano-ken (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 48 days.

(21) Appl. No.: 08/847,339

(22) Filed: Apr. 23, 1997

(65) Prior Publication Data

US 2002/0047503 A1 Apr. 25, 2002

Related U.S. Application Data

(63) Continuation of application No. 08/454,305, filed as application No. PCT/JP94/01721 on Oct. 13, 1994, now abandoned.

(30) Foreign Application Priority Data

Oct. 18, 1993 (JP) .............................. 5-260174

(51) Int. Cl.$^7$ .............................. H01L 41/08
(52) U.S. Cl. .................. 310/361; 310/312; 310/368
(58) Field of Search .................. 310/360, 361, 310/368, 312

(56) References Cited

U.S. PATENT DOCUMENTS 3,792,294 A * 2/1974 Royer ....................... 310/361
4,071,797 A * 1/1978 Zumsteg et al. .......... 310/361
4,076,987 A * 2/1978 Zumsteg ................... 310/361
4,247,797 A * 1/1981 Echigo et al. ............. 310/361
4,525,647 A * 6/1985 Dworsky ................... 310/361

FOREIGN PATENT DOCUMENTS

| JP | 52-91681 | 8/1977 |
| JP | 55-9128 | 1/1980 |
| JP | 58-107616 | 7/1983 |
| JP | 60-160633 | 10/1985 |
| JP | 64-58107 | 3/1989 |
| JP | 1-135213 | 5/1989 |
| JP | 2-26405 | 1/1990 |
| JP | 2-124614 | 5/1990 |
| JP | 2-198213 | 8/1990 |
| JP | 4-146987 | 5/1992 |
| JP | 4-294622 | 10/1992 |
| JP | 5-83064 | 4/1993 |

* cited by examiner

Primary Examiner—Mark O. Budd
(74) Attorney, Agent, or Firm—Oliff & Berridge, PLC

(57) ABSTRACT

An object of the present invention is to provide a quartz resonator unit and a quartz oscillator having a small size and a light weight and having the capability of oscillating in the overtone mode, and also to provide a quartz element for use in the quartz resonator unit and quartz oscillator. Thus, a further object is to determine the optimum width-to-thickness ratio of the quartz element at which the quartz element having a width less than 1.5 mm and a length less than 4.7 mm does not show coupling with spurious vibrations over the entire range of operation temperature. From the experiments and evaluation performed repeatedly, it has been concluded that an AT-cut rectangular quartz element having the width-to-thickness ratio w/t in a range selected from the group consisting of 8.48 0.05, 12.18+/−0.05, 13.22+/−0.07, 14.78+/−0.07, and 15.57 0.07 is suitable as a small-sized quartz element that can oscillate at a high frequency and has excellent temperature characteristics. There are also disclosed important factors to obtain a quartz element having a low resonance resistance.

58 Claims, 30 Drawing Sheets

RECTANGULAR AT-CUT QUARTZ ELEMENT, QUARTZ RESONATOR, QUARTZ RESONATOR UNIT AND QUARTZ OSCILLATOR, AND METHOD OF PRODUCING QUARTZ ELEMENT

This is a Continuation of application Ser. No. 08/454,305 filed Aug. 17, 1995 now abandoned, which in turn is a U.S. National Stage Application of PCT/JP94/01721 filed Oct. 13, 1994.

FIELD OF THE INVENTION

The present invention relates to a quartz element, quartz resonator, quartz resonator unit, and oscillator using these component elements and particularly to an AT-cut quartz element having a rectangular shape for use in an overtone oscillating operation. Furthermore, the present invention relates to a production method suitable for producing such a quartz element, quartz resonator, and quartz resonator unit.

DESCRIPTION OF RELATED ART

Quartz resonator units perform their oscillating operation based on the piezoelectric effect of single crystal quartz. They can provide very stable oscillation at a constant frequency and are used in a wide variety of applications. In particular, quartz resonator units and quartz oscillators are used as reference clock generators in various electronic systems, such as communications systems, electronic data processing systems, etc. Recent trends in these electronic systems are toward smaller sizes, lighter weights, higher operating frequencies, and higher operating speeds. These trends strongly demand quartz resonator units having a smaller size and lighter weight and also having the capability of oscillating stably at a higher frequency.

AT-cut quartz elements cut out from a single-crystal quartz exhibit excellent frequency-temperature characteristics over a wide temperature range. Furthermore, AT-cut quartz elements also show a very small variation in frequency in long-term operation. The AT-cut quartz element is shaped into a rectangular form having a length l in the X-axis, thickness t in the Y'-direction, and width w in the Z'-direction, wherein the length l is greater than the other dimensions, and placed in a small-sized quartz holder having a cylinder shape, which is sealed. For this reason, together with the excellent characteristics described above, the AT-cut quartz element is advantageously used to construct a small-sized high-performance quartz resonator unit. The X-axis, Y-axis, and Z-axis refer to the electrical axis, mechanical axis, and optical axis, respectively, of a single crystal quartz, and the Y'-axis and Z'-axis refer to the Y-axis and Z-axis rotated about the X-axis by about 35°.

To provide an oscillator using a quartz resonator unit in the form of a surface mounting device (SMD), which can be mounted on a circuit board in the same manner as ICs, it is required that the quartz resonator unit is accommodated in a small-sized holder having a diameter of 2 mm or less and a length of about 6 mm so that the oscillator may be used in conjunction with advanced integrated circuits having a small size. As reported in the 21st EM symposium (Papers of Technical Meeting on Electronic Circuits, IEEJ, pp. 37–42, May 22, 1992), quartz elements having such a small size that can be accommodated in a quartz holder having a cylindrical form so that they can oscillate at a fundamental frequency have been achieved already. However, quartz resonator units that oscillate at a fundamental frequency can cover only a low frequency range, such as 17 MHz to 40 MHz, and they cannot be used in high frequency bands greater than 40 MHz required in high-speed electronic systems such as those described above.

The oscillation frequency of an AT-cut quartz element varies inversely with its thickness t. Therefore, if the fundamental frequency exceeds 40 MHz, then the thickness of the quartz element becomes less than 42 μm, and thus, production becomes very difficult. Therefore, to realize quartz resonator units that can oscillate at high frequencies, it is necessary to develop a quartz element that can be used in the overtone oscillation mode and a quartz resonator unit using such a quartz element. To accommodate a quartz element in such a small-sized holder as described above, its length l should be less than 5 mm, and its width w should be less than 1.5 mm. However, if an AT-cut quartz element having such a small size is used for overtone oscillation, spurious vibration often occurs near the thickness shear mode of the main vibration. Furthermore, coupling occurs between the spurious vibration and the main vibration, and an even small temperature change, such as 5° C.–10° C., causes a jump in oscillation frequency. Thus, in the case of a quartz element having such a small size, an optimum shape of the quartz element, especially regarding the width-to-thickness ratio (the ratio of width w to thickness t), is not known yet that gives a cubic-curve frequency-temperature characteristic, which is essential in AT-cut quartz resonator units, in the required temperature range (about −20° C. to about +80° C.).

In quartz resonators using a small quartz element, energy trapping of the thickness shear mode of the main vibration is often insufficient, which causes degradation in resonance resistance Rr. In small-sized quartz elements and quartz resonators, especially such ones used in the overtone oscillation mode, the dependencies of their dimensions, the surface roughness, the width of electrodes, and the weight of electrodes on the resonance resistance Rr are not known.

In surface processing, if the surface roughness is improved, it is possible to decrease the resonance resistance Rr in processing. However, the resonance resistance Rr varies from product to product. Therefore, in usage of such a quartz element having a small size, just a simple improvement in the surface roughness does not lead to practical production of high-performance quartz elements at low cost, since it is impossible to obtain a sufficiently high yield in production.

Thus, it is an object of the present invention to provide a quartz element, quartz resonator, and quartz resonator unit having a sufficiently small size and light weight so that they can be used in the form of SMDs, like ICs, and thus provide a quartz oscillator using such elements. Thus, more specifically, it is an object of the present invention to provide a quartz element having a length l less than about 5 mm and a width w less than about 1.5 mm that is shaped such that it can oscillate in the overtone mode with good temperature characteristics. It is a further object of the present invention to provide a quartz resonator unit using such a small-sized quartz element, or quartz resonator, that has a low resonance resistance Rr and thus can be used in practical applications. It is further object of the present invention to provide a method of producing, with a high production yield, a quartz element, quartz resonator, and quartz resonator unit having excellent temperature characteristics and a low resonance resistance Rr.

SUMMARY OF THE INVENTION

To achieve such a quartz resonator unit having a small size and also having the capability of oscillating at a high frequency, the inventor of the present invention has performed experiments and evaluations repeatedly, and finally succeeded in achieving a small-sized quartz element for use in overtone oscillations, which exhibits no coupling with spurious vibrations over the entire temperature range in which a quartz resonator unit using the quartz element is expected to operate. Such a quartz element is an AT-cut quartz element shaped in a rectangular form for use in a third overtone quartz resonator unit, characterized in that it has a length l along the X-axis, a thickness t along the Y'-axis, and a width w along the Z'-axis, wherein the width-to-thickness ratio w/t is in a range selected from the group consisting of 8.48±0.05, 12.18±0.05, 13.22±0.07, 14.78±0.07, and 15.57 0.07.

The inventor of the present invention, after further experiments and evaluation, has also succeeded in achieving a quartz element characterized in that it has a length l, along the X-axis, in the range of 4000 μm to 4700 μm and a width w in the range of 800 μm to 1500 μm so that it can form a quartz resonator unit having an excellent resonance resistance.

Furthermore, the inventor of the present invention has succeeded in achieving a quartz element characterized in that its surface is etched such that the maximum height Rmax of its surface roughness is in the range of 0.2 μm to 0.7 μm or, more preferably, in the range of 0.3 μm to 0.6 μm so that it has an excellent resonance resistance. In conventional quartz elements, the surface is simply processed such that it becomes as flat as possible thereby reducing the resonance resistance. In contrast, in the present invention, the surface roughness is controlled in the range described above so as to achieve not only a low resonance resistance, but also an extremely high production yield.

In the present invention, such quartz elements are produced by cutting a quartz crystal into the form of an AT-cut wafer and further lapping and etching the surface of the wafer. In the production, it is preferable that the reduction in the thickness per surface resulting from the etching process, that is, the half of the total reduction in the thickness (hereafter, referred to as etched thickness) be in the range of 0.5 μm–2.5 μm, and furthermore, it is preferable that the maximum height Rmax of the surface roughness be in the range of 0.3 μm–0.7 μm at the stage just before the etching process. In the finish lapping process performed just before the etching process, it is effective that the lapping is performed using an alumina-based abrasive having an average grain size of 2.5 μm–3 μm. The etching process can be performed using 10–30 wt % hydrofluoric acid as an etchant.

Regarding the electrodes formed on the opposite surfaces separated by the thickness of the quartz element, the quartz element having the width-to-thickness ratio w/t in the range of 8.48±0.05 can have excellent resonance resistance and temperature characteristics if the electrodes are formed such that the width W of the electrode, measured in the direction along the Z'-axis, is smaller than the width w of the rectangular AT-cut quartz element, wherein the spaces between the edges of the width of the electrode and the edges of the width of the AT-cut quartz element are in the range from 75 μm to 230 μm or, more preferably, in the range from 75 μm to 200 μm. Similarly, rectangular AT-cut quartz elements having the width-to-thickness ratio w/t in the range of 12.18+/−0.05, 13.22+/−0.07, 14.78+/−0.07, or 15.57 +/−0.07, the rectangular AT-cut quartz elements exhibit excellent characteristics when the above-described spaces between the electrode edges and the quartz element edges are in the range of 75 μm to 340 μm or, more preferably, 75 μm to 200 μm. Regarding the thickness of electrode films deposited by means of, for example, evaporation, an excellent resonance resistance characteristic can be obtained if the thickness is controlled in such a range that the change in the oscillation frequency of the rectangular AT-cut quartz element having deposited electrode films, relative to the frequency of the rectangular AT-cut quartz element having no electrodes, is in the range of 7000 to 30000 PPM.

If such a rectangular AT-cut quartz element is used to form a quartz resonator unit, then it is possible to obtain a quartz resonator unit having a small size and light weight and having the capability of oscillating at a high frequency. As for a supporting mechanism for supporting a quartz element, the quartz element can be supported by lead wires connected to one end of each electrode of the quartz element at its one end along the X-axis, wherein the connection may be formed by means of soldering or a conductive adhesive. Furthermore, the quartz element fabricated in the above-described manner can be small enough to be accommodated in a holder having a diameter of 2.0 mm±0.2 mm and a length of 6.0 mm+/−0.5 mm, thereby achieving stable oscillation at a high frequency. The quartz holder may be molded with a molding material. Furthermore, the quartz holder may also be molded together with an integrated circuit including an oscillation circuit, thereby achieving a quartz oscillator suitable to be mounted on the surface of a circuit board.

Each element and its structure will be described below in more detail referring to preferred embodiments of the invention. However, it should be understood that the invention is not limited to these specific embodiments of quartz elements, quartz resonators, or quartz resonator units, except as defined in the appended claims.

DESCRIPTION OF THE PREFERRED EMBODIMENTS

Production Process of Quartz Resonator Unit

Figure 1:
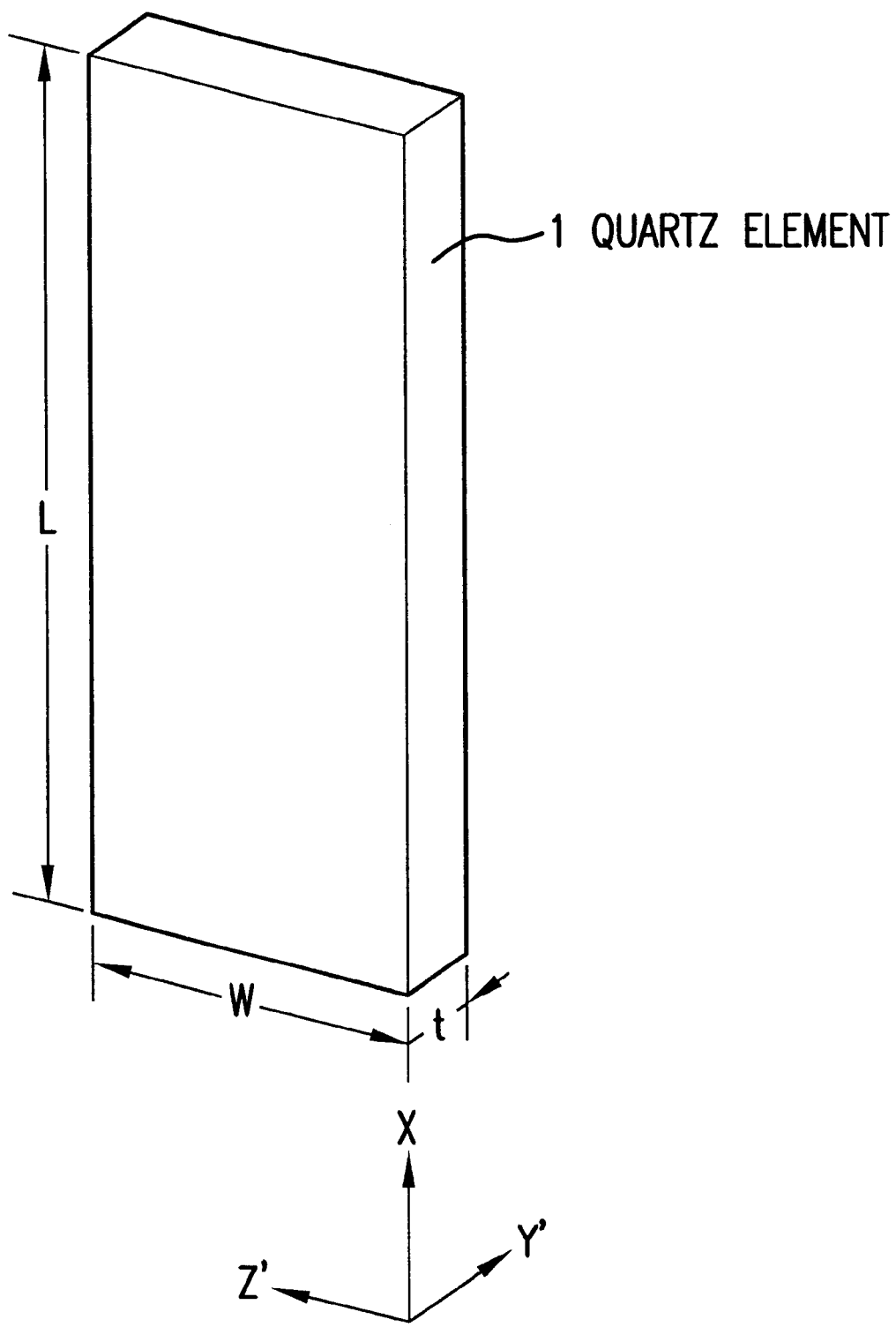
FIG. 1 is a perspective view illustrating the outline of an embodiment of a quartz element produced according to the present invention.

FIG. 1 is a schematic diagram illustrating a quartz element 1 according to the present invention. According to the present embodiment of the invention, the quartz element 1 is cut out from a single-crystal quartz and shaped into a rectangular form thereby forming a rectangular AT-cut quartz element having length l along the X-axis, thickness t along the Y'-axis, and width w along the Z'-axis, wherein coordinate system XY'Z' is defined as shown in FIG. 1.

Figure 2:
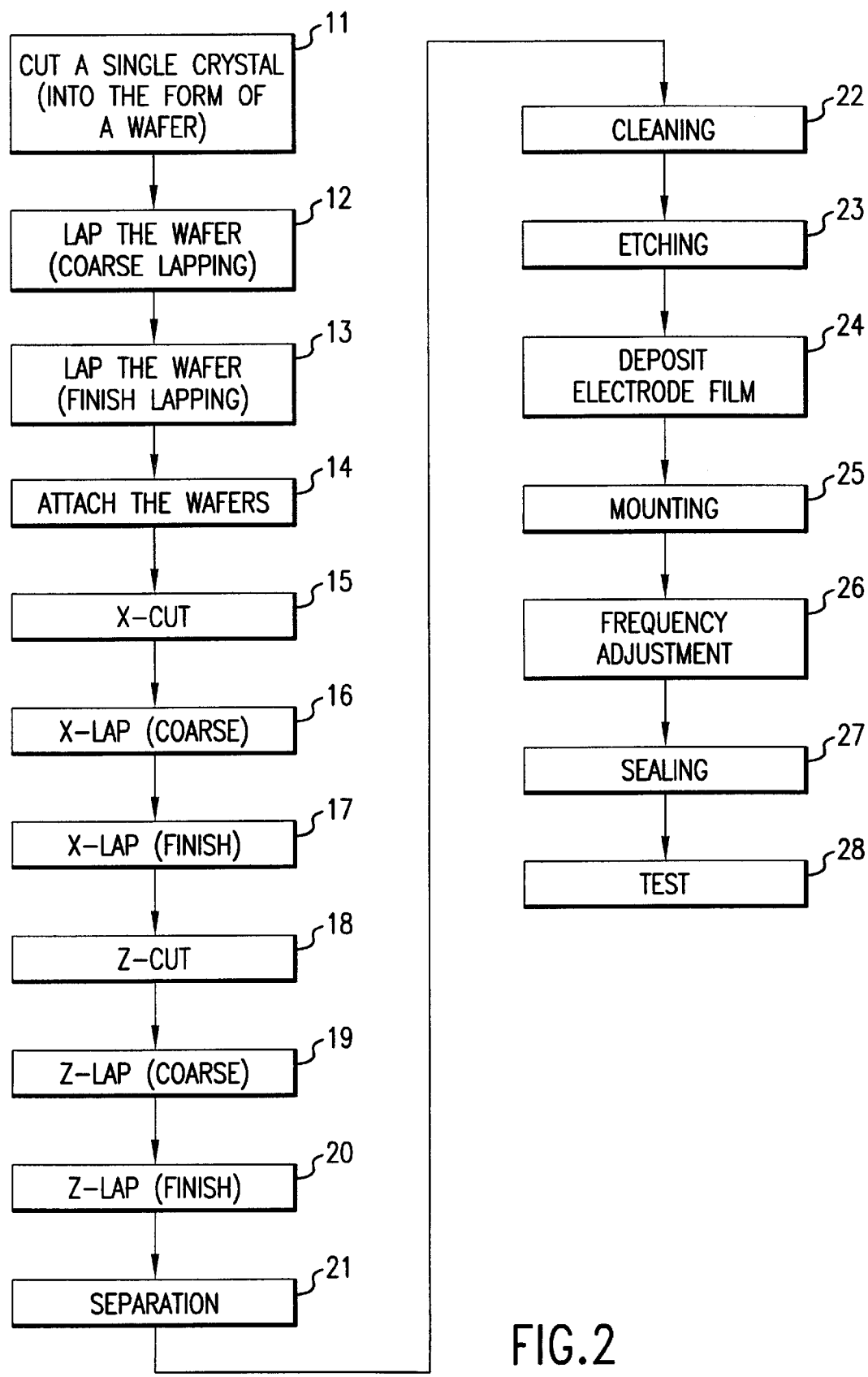
FIG. 2 is a flow chart illustrating a process for producing a quartz element, quartz resonator, and quartz resonator unit according to an embodiment of the present invention.

FIG. 2 illustrates a process for producing a quartz element, quartz resonator, and quartz resonator unit according to the present invention. First, in step 11, a single-crystal quartz is cut (AT-cut) at a desired angle into the shape of wafers. In step 12, the surface of a wafer is subjected to coarse lapping with a silicon carbide abrasive having a grain size of #1500 or a similar grain size. In step 13, the wafer surface is further subjected to finish lapping with an alumina-based abrasive having an average grain size in the range of 2.5 $\mu$m to 3 $\mu$m. In this finish lapping process, the surface of the wafer is lapped so that the maximum value Rmax of the surface roughness of the wafer becomes less than 0.7 $\mu$m. In the experiments described here, the maximum height Rmax of the surface roughness was measured using a surface roughness measurement tool called "Talysurf 6" produced by Rank-Taylor-Hobson Co.

In the present invention, as opposed to conventional techniques, polishing, using a polishing abrasive, is not performed in the finish lapping process of the surface of the quartz element 1. An intermediate lapping process may be performed, as required, between processes 12 and 13 using a silicon carbide abrasive having a grain size of #3000 or a similar grain size.

Then, in step 14, a plurality of lapped wafers are attached to each other, and the attached wafers are cut into quartz elements having desired dimensions or a desired width-to-thickness ratio and length. That is, in step 15, the wafers are cut along planes perpendicular to the X-axis to obtain X-cut sections. Then, in steps 16 and 17, the surfaces exposed by cutting are lapped under the same conditions as in steps 12 and 13. After the completion of the lapping process on the surfaces perpendicular to the X-axis, the wafers are cut, in step 18, along planes perpendicular to the Z-axis so that Z-cut sections are obtained. Furthermore, in steps 19 and 20, the surfaces exposed by the cutting are lapped in the same manner as in the above-described steps.

Although, when wafers are cut from a single-crystal quartz, they have a rather large size, such as a few ten mm square, their end faces have a very small size that correspond to the size of a final quartz element to be fabricated. To avoid difficulty in processing such small end faces, a plurality of wafers are bonded to each other via beeswax or the like and then cut into a plural pieces of elements. Their cut end faces are then lapped so that desired surface flatness on the small end faces of quartz elements is obtained.

After the lapping process on the end faces, quartz elements are separated from each other in step 21 and then cleaned in step 22. The length l and width w of quartz elements are measured using a dial gauge with 1 $\mu$m accuracy, wherein the scale of the dial gauge is calibrated with a standard block gauge before each measurement. The thickness t is measured by mounting a quartz element with no electrodes on a raw-element oscillator and evaluating its oscillation frequency. That is, the thickness t can be obtained by substituting the measured oscillation frequency into the following equation:

$$t = 3 \times C/f \tag{1}$$

where C is the frequency constant for the fundamental vibration, that is 1670 μm-MHz, and f is the third-overtone oscillation frequency of the quartz element. The oscillation frequency is measured with accuracy of 1 KHz, and the thickness t (μm) is determined from the measured oscillation frequency.

In the present embodiment, the quartz element is shaped according to the above-described process such that it has sufficiently small dimensions to be accommodated in a cylinder about 2 mm in diameter and about 6 mm in length. Taking into account the dimensions of a base for supporting the quartz element, the upper limit of the length l of the quartz element is 4700 μm. The upper limit of the width w is 1500 μm, which is determined by the inner diameter of the holder.

Then, in step 23, each quartz element is etched. In this etching process, 10–30 wt % hydrofluoric acid is used as an etchant. The region including strain and damage induced by the lapping process is removed by etching.

Figure 3:
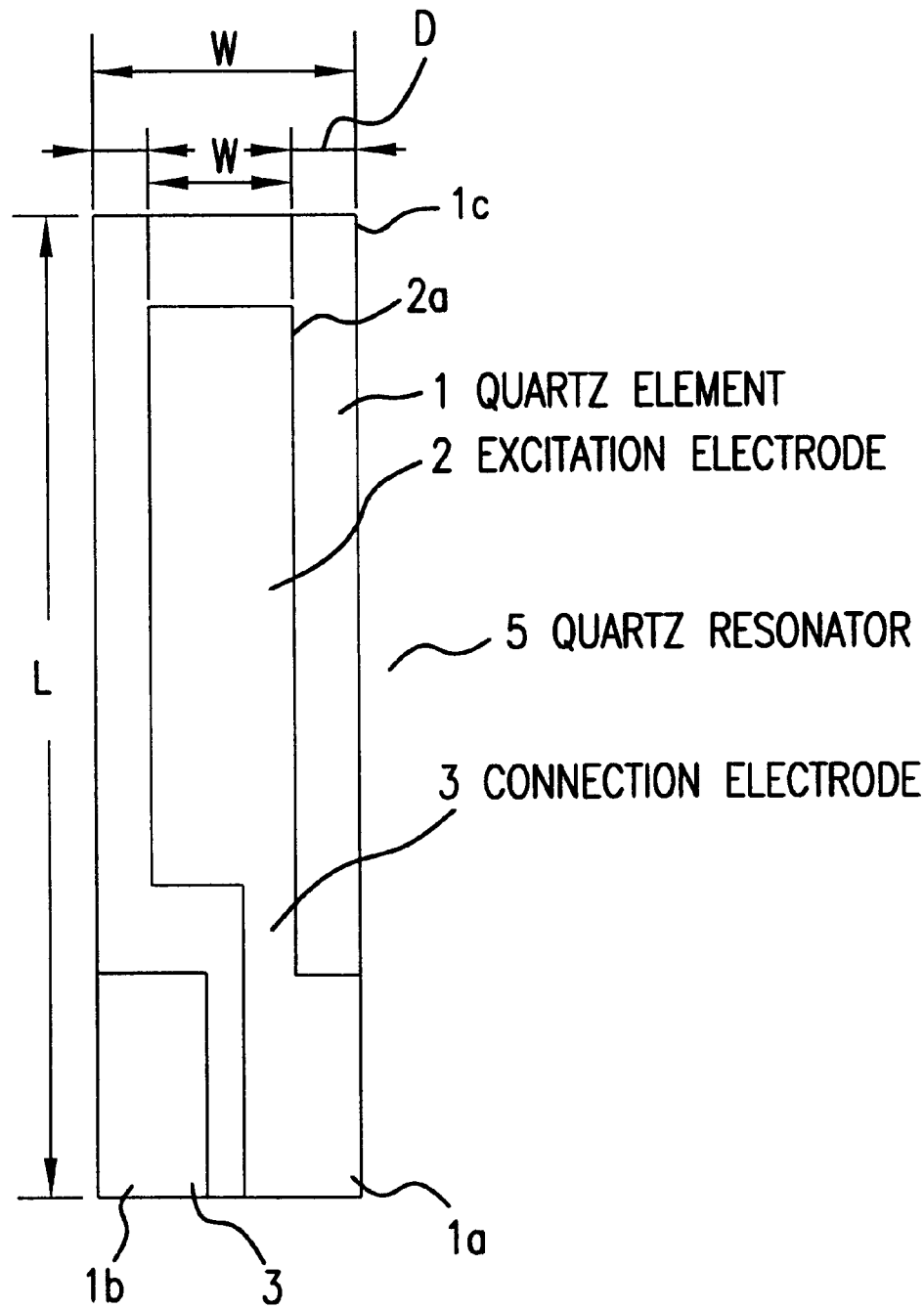
FIG. 3 is a plan view illustrating the structure of a quartz resonator according to an embodiment of the present invention.

In step 24, an electrode material is deposited on both surfaces separated by the thickness t, by means of evaporation or sputtering. In the present embodiment, the electrode is formed by depositing chrome, nickel, silver, or gold, or otherwise depositing these materials one on another in the form of a multi-layer structure. FIG. 3 is a schematic diagram illustrating a quartz resonator 5 including a quartz element 1 with deposited electrodes. In the quartz resonator of the present embodiment, an excitation electrode 2, having a nearly rectangular shape with width W, is formed in a substantially central area of the surface of the quartz element 1 such that the excitation electrode 2 extends along the length of quartz element. In addition, a connection electrode 3 is formed from the excitation electrode 2 toward a corner 1a at an end of the length of the quartz element 1. Furthermore, a connection electrode 3 is formed in a corner area 1b adjacent to the corner 1a, wherein the connection electrode 3 is connected to an excitation electrode formed on the opposite surface of the quartz element 1.

The formation of these connection electrodes is controlled so that the space D between the longer edge 2a of the electrode formed on the surface of the quartz element 1 and the longer edge 1c of the quartz element has a predetermined value, and the film thickness of the electrode is controlled by monitoring the oscillation frequency of the quartz element 1 during the deposition process, as will be described in more detail later.

Then, in step 25, leads are connected to the respective connection electrodes wherein the leads not only serve as electrical paths for supplying a current to the electrodes but also as supporting elements for mechanically supporting the quartz resonator. The leads may be connected to the electrodes by means of soldering or a conductive adhesive, such as a silver-filled epoxy adhesive or a polyimide-based adhesive.

In step 26, final adjustment of the oscillation frequency of the quartz resonator unit is performed by depositing a small amount of silver on the electrode or by slightly removing a surface portion of the electrode. In step 27, the quartz resonator is inserted into a cylindrical holder, wherein the insertion is performed in a vacuum chamber while heating the quartz resonator so that adsorbed gas is removed. The holder is then sealed in a vacuum atmosphere, and thus a complete quartz resonator unit is obtained. The sealing may also be performed in an inert gas atmosphere instead of in vacuum.

Figure 4:
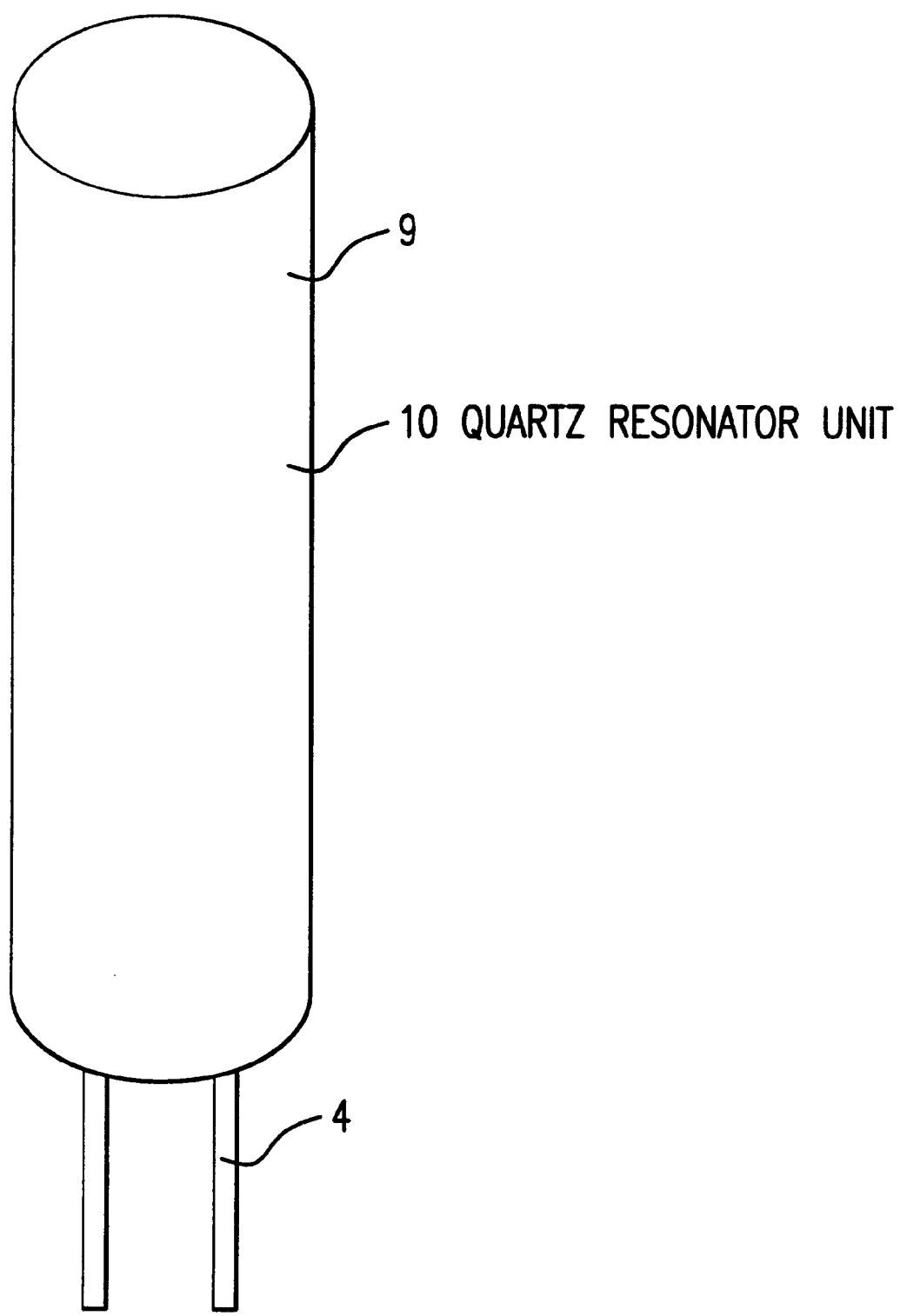
FIG. 4 is a perspective view illustrating the outline of a quartz resonator unit according to an embodiment of the present invention.
Figure 5:
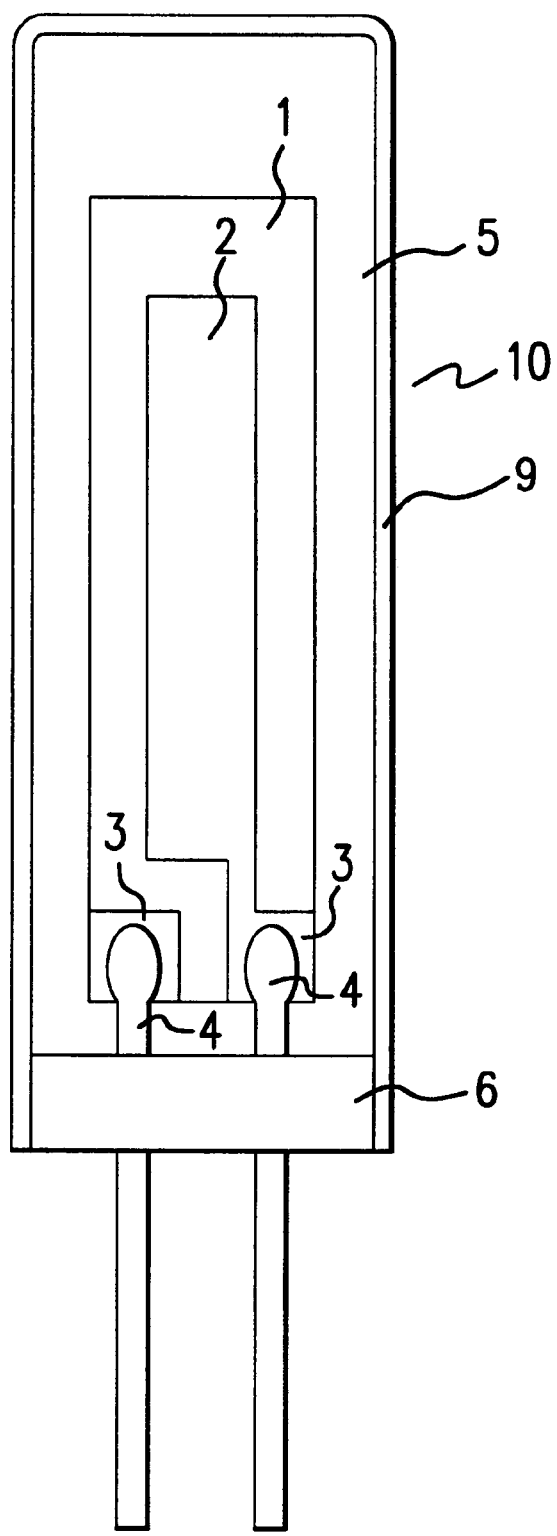
FIG. 5 is a schematic diagram illustrating the inside of the quartz resonator unit of FIG. 4 seen along the Y' axis.
Figure 6:
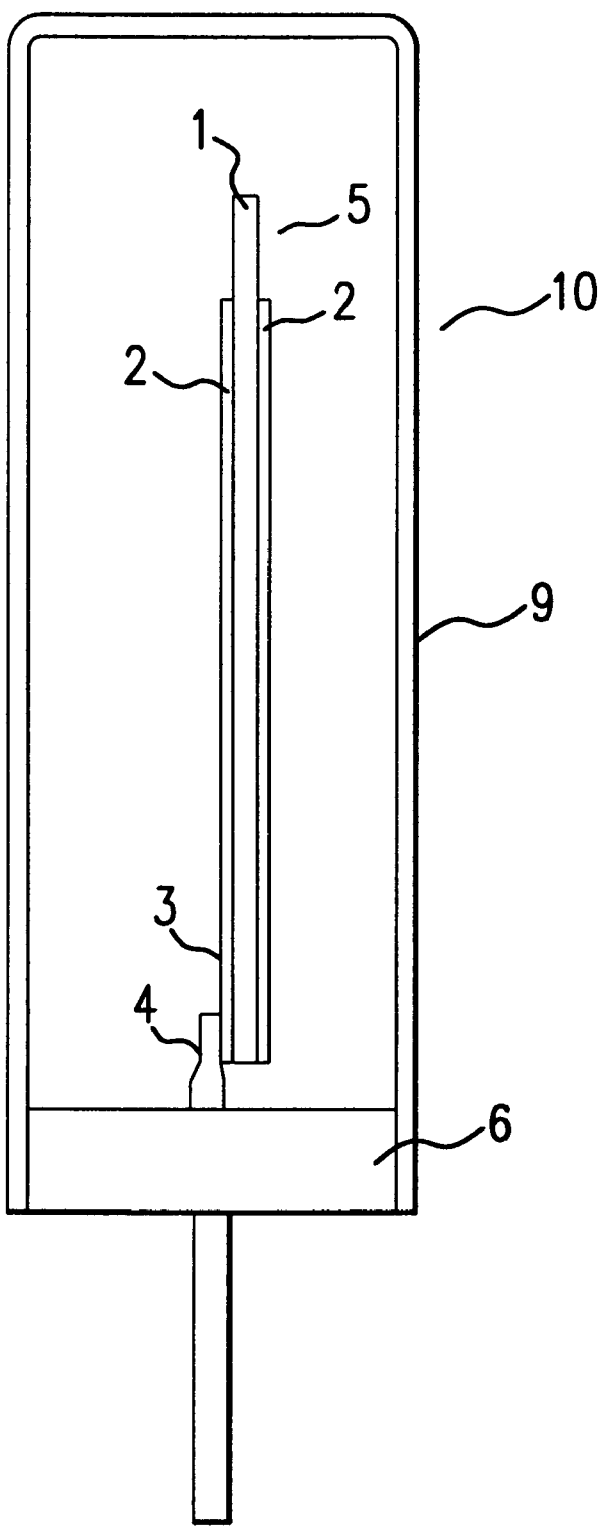
FIG. 6 is a schematic diagram illustrating the inside of the quartz resonator unit of FIG. 4 seen along the Z' axis.

FIG. 4 is a schematic diagram illustrating the quartz resonator unit, and FIGS. 5 and 6 illustrate its cross-sections.

In the present embodiment, the quartz resonator unit 10 includes a cylindrical holder 9 having a diameter of 2.0 mm+/−0.2 mm and a length of 6.0 mm+/−0.5 mm. The quartz resonator 5 is housed in the holder 9 and the holder 9 is then sealed. The connection electrodes 3 are connected to the respective leads 4. The leads 4 extend toward the outside of the holder 9, via the base 6, so that electric power required for oscillation can be supplied to the quartz resonator 5 through the leads 4.

In this way, a third-overtone quartz resonator unit is assembled according to the invention and subjected, in step 28, to a final test with respect to the frequency, resonance resistance Rr (which is an equivalent series resistance Rr appearing when the quartz resonator unit is in an oscillating operation), temperature characteristics such as the dependence of the oscillation frequency and the resonance resistance Rr on temperature, etc.

Temperature Characteristics

Although AT-cut quartz elements have various vibrational modes, the main vibrational mode is the thickness shear mode occurring in rectangular AT-cut quartz elements. The other modes, such as the face shear mode and the flexure mode, act as spurious vibrations. It is very important to set the width-to-thickness ratio to a value that can suppress these spurious vibrations over the entire operation temperature. The frequency associated with each mode can be calculated. However, in addition to the predictable vibrations, coupling with spurious vibrations occurs. The coupling depends on the shape and the dimensions of a quartz element and cannot be predicted by calculation. In particular, in the case of a small-sized AT-cut quartz element, such as that described above, an optimum width-to-thickness ratio E (w/t) that can suppress the spurious vibrations to a sufficiently low level required in practical applications was not known. In view of the above, the inventor of the present invention has evaluated many quartz elements having various dimensions fabricated according to the above-described fabrication method and has succeeded in determining an optimum width-to-thickness ratio E that can suppress the spurious vibrations over the entire range of the operation temperature.

EXAMPLE 1

FIG. 7 shows the temperature characteristics of quartz resonator units, wherein one has a width-to-thickness ratio E of 12.18 and the others have a value close to 12.18 and wherein these quartz resonator units were fabricated according to the above-described fabrication method so that they oscillate at a frequency f of 55.0 MHz in the third-overtone mode. The length l of the quartz element used in these quartz resonator units is 4200 μm and the width w is about 1100 μm, wherein the width w is adjusted so that they oscillate at the given frequency f according to the following equation:

$$w = E \times (3 \times C/f) \tag{2}$$

Figure 7A:
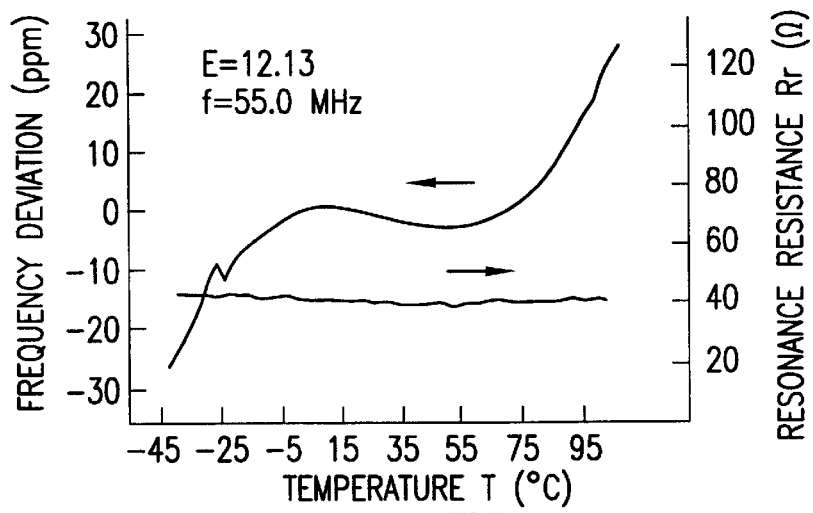
FIG. 7 is a graph illustrating the temperature characteristics of quartz resonator units fabricated using a quartz element having a width-to-thickness ratio E of about 12.18.
Figure 7B:
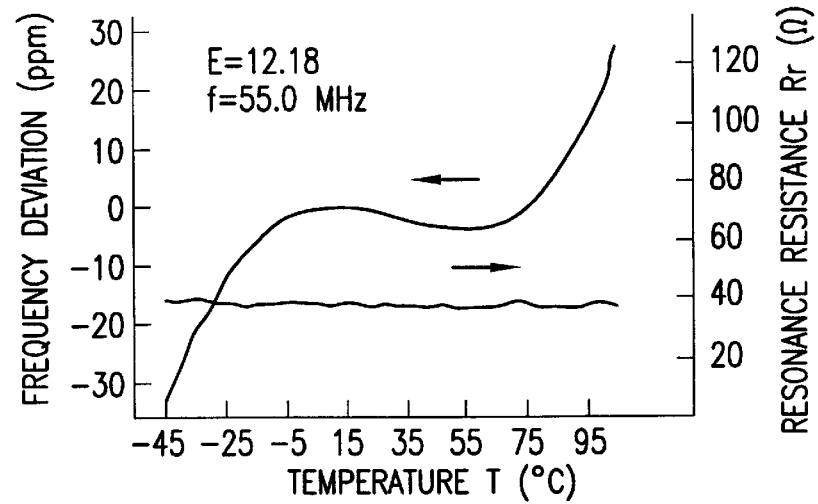

FIG. 7(b) shows the temperature characteristics of a quartz resonator unit having a quartz element with a width-to-thickness ratio of just 12.18. As can be seen in the figure, the frequency-temperature characteristic of this quartz resonator unit exhibits a stable cubic-curve that is essential to the AT-cut quartz element. Other vibrational modes or the coupling with the spurious vibrations are not observed in the temperature range from −45° C. to +95° C. The resonance resistance Rr has a value as low as 40Ω and is substantially constant, which means that there is no coupling with the spurious vibrations. In the evaluation, the resonance resistance Rr and the deviation in frequency from a reference frequency at 25° C. as defined in the following equation (3) (hereafter referred to simply as the frequency deviation) were measured using the measurement system MODEL 2100 produced by Sunders Co.:

$$\text{Frequency Deviation} = (f_T - f_{25})/f_{25} \quad (3)$$

where $f_T$ denotes the oscillation frequency at an arbitrary temperature, and $f_{25}$ denotes the oscillation frequency at 25°. In the other examples described later, the evaluation was done in the same way.

Figure 7C:
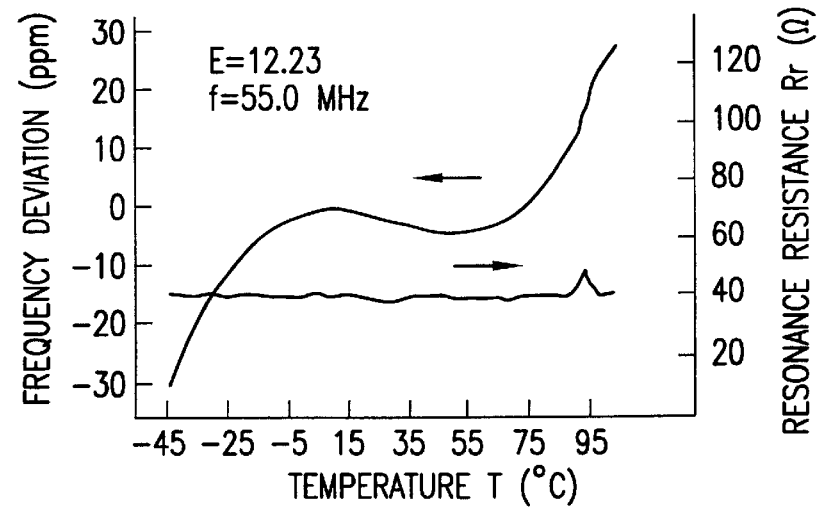

FIG. 7(a) shows the temperature characteristics of a quartz resonator unit having a quartz element with a width-to-thickness ratio of 12.13, and FIG. 7(c) shows the temperature characteristics of a quartz resonator unit having a quartz element with a width-to-thickness ratio of 12.23. These two samples were fabricated and evaluated in the same manner as the first one described above. In the temperature characteristics of the quartz resonator unit having the width-to-thickness ratio of 12.13, coupling with the spurious vibration is observed at temperatures near −25° C. In the case of the quartz resonator unit having the width-to-thickness ratio of 12.23, on the other hand, coupling with the spurious vibration is observed at temperatures near 95° C. This means that if the width-to-thickness ratio is controlled in the range from 12.13 to 12.23, then stable oscillation can be achieved over the required temperature range from −20° C. to +80° C. without coupling with the spurious vibrations. No coupling with the spurious vibrations occurs over the required temperature range from −20° C. to +80° C.

Figure 8:
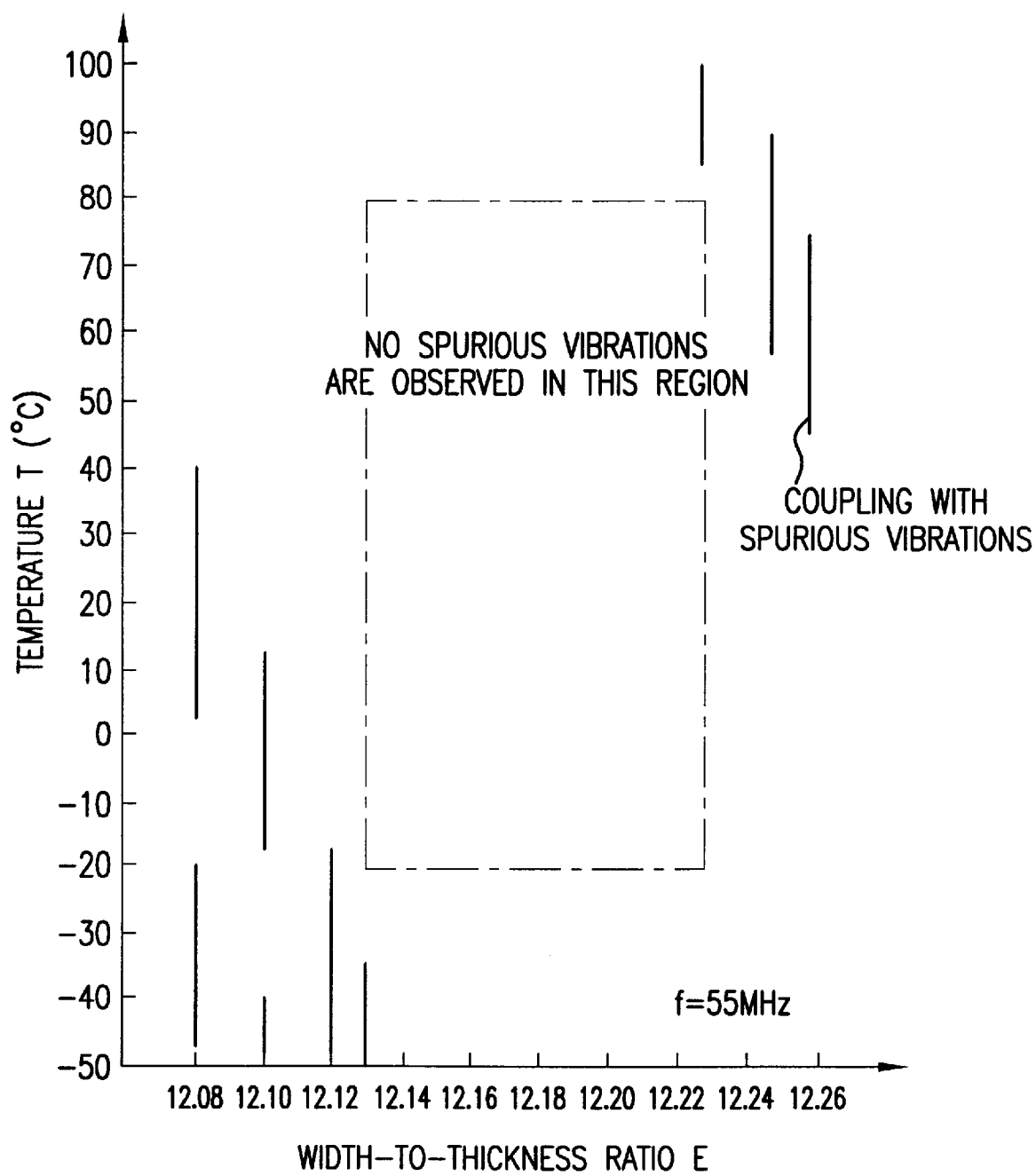
FIG. 8 is a graph illustrating the characteristic with respect to the coupling with spurious vibration for quartz resonator units fabricated using a quartz element having a width-to-thickness ratio E of about 12.18.

FIG. 8 summarizes the temperature characteristics of quartz resonator units having different width-to-thickness ratios close to 12.18, wherein solid lines represent such ranges where coupling with the spurious vibrations is observed. As described above, the inventor of the present invention has determined experimentally the optimum range of the width-to-thickness ratio of the quartz element in which the quartz resonator unit using the quartz element shows no coupling with the spurious vibrations over the required temperature range from −20° C. to +80° C. That is, the optimum range of the width-to-thickness ratio is 12.18+/−0.05 as represented by the area surrounded by the alternate long and short dash lines in FIG. 8.

EXAMPLE 2

Figure 9A:
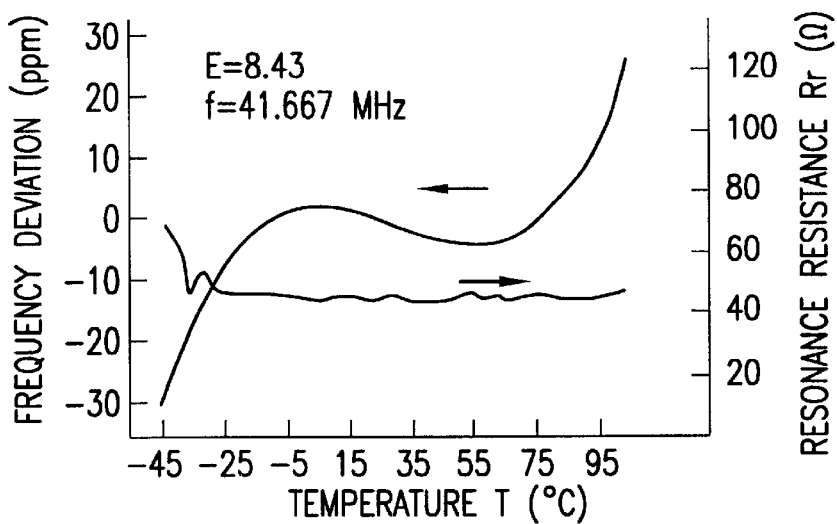
FIG. 9 is a graph illustrating the temperature characteristics of quartz resonator units fabricated using a quartz element having a width-to-thickness ratio E of about 8.48.
Figure 9B:
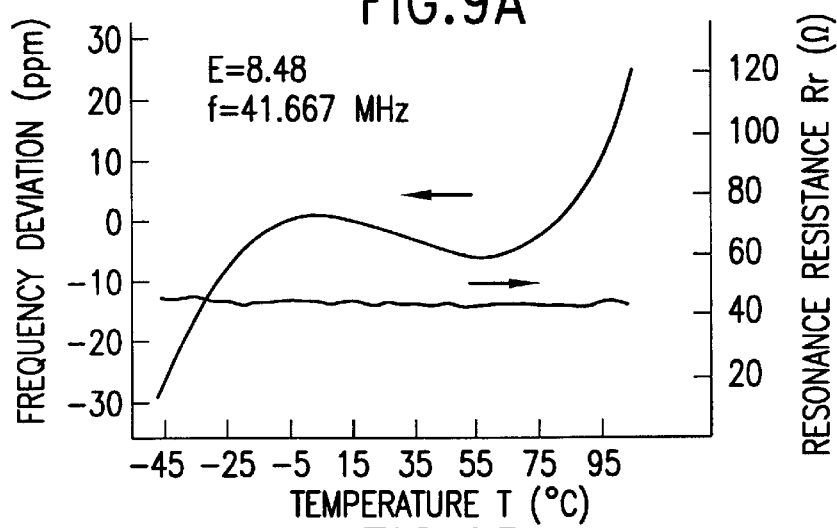

FIG. 9 shows the temperature characteristics of quartz resonator units, wherein one has a width-to-thickness ratio E of 8.48 and the others have a value close to 8.48 and wherein these quartz resonator units were fabricated according to the above-described fabrication method so that they oscillate at a frequency f of 41.667 MHz in the third-overtone mode. The length l of the quartz element used in these quartz resonator units is 4200 μm, and the width w is about 1020 μm, wherein the width w is adjusted as in the first example described above so that they oscillate at the given frequency f. FIG. 9(b) shows the temperature characteristics of a quartz resonator unit having a quartz element with a width-to-thickness ratio of just 8.48. The characteristics with respect to frequency deviation and resonance resistance Rr indicates that there occurs no other vibrational modes, that is, there is no coupling with the spurious vibrations over the temperature range from −45° C. to +95° C. The resonance resistance Rr has a value as low as about 50Ω and is substantially constant.

Figure 9C:
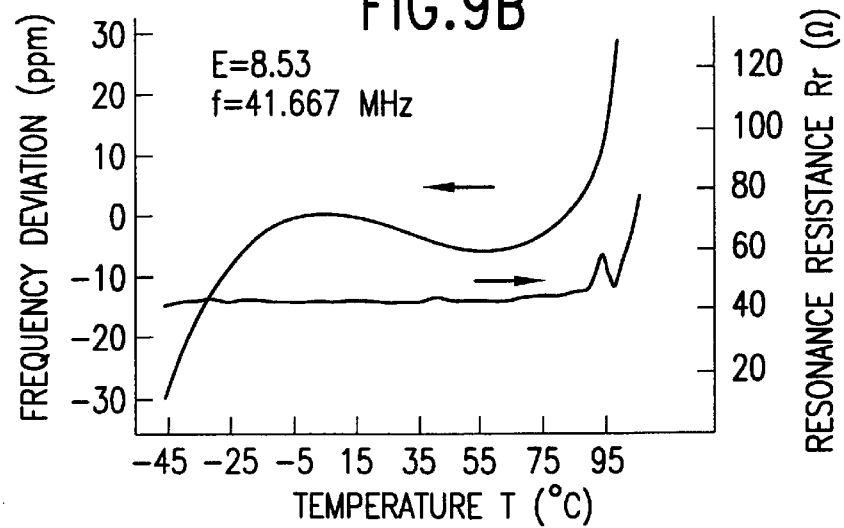

FIG. 9(a) shows the temperature characteristics of a quartz resonator unit having a quartz element with a width-to-thickness ratio of 8.43, and FIG. 9(c) shows the temperature characteristics of a quartz resonator unit having a quartz element with a width-to-thickness ratio of 8.53. These two samples were fabricated and evaluated in the same manner as the first one described above. In the temperature characteristics of the quartz resonator unit having the width-to-thickness ratio of 8.43 coupling with the spurious vibration is observed at temperatures near −25° C. In the case of the quartz resonator unit having the width-to-thickness ratio of 8.53, on the other hand, coupling with the spurious vibration is observed at 80° C. or higher. Thus, if the width-to-thickness ratio of the quartz element is controlled in the range from 8.43 to 8.53, then the stable oscillation can be achieved over the required temperature range from −20° C. to +80° C. without coupling with the spurious vibrations.

Figure 10:
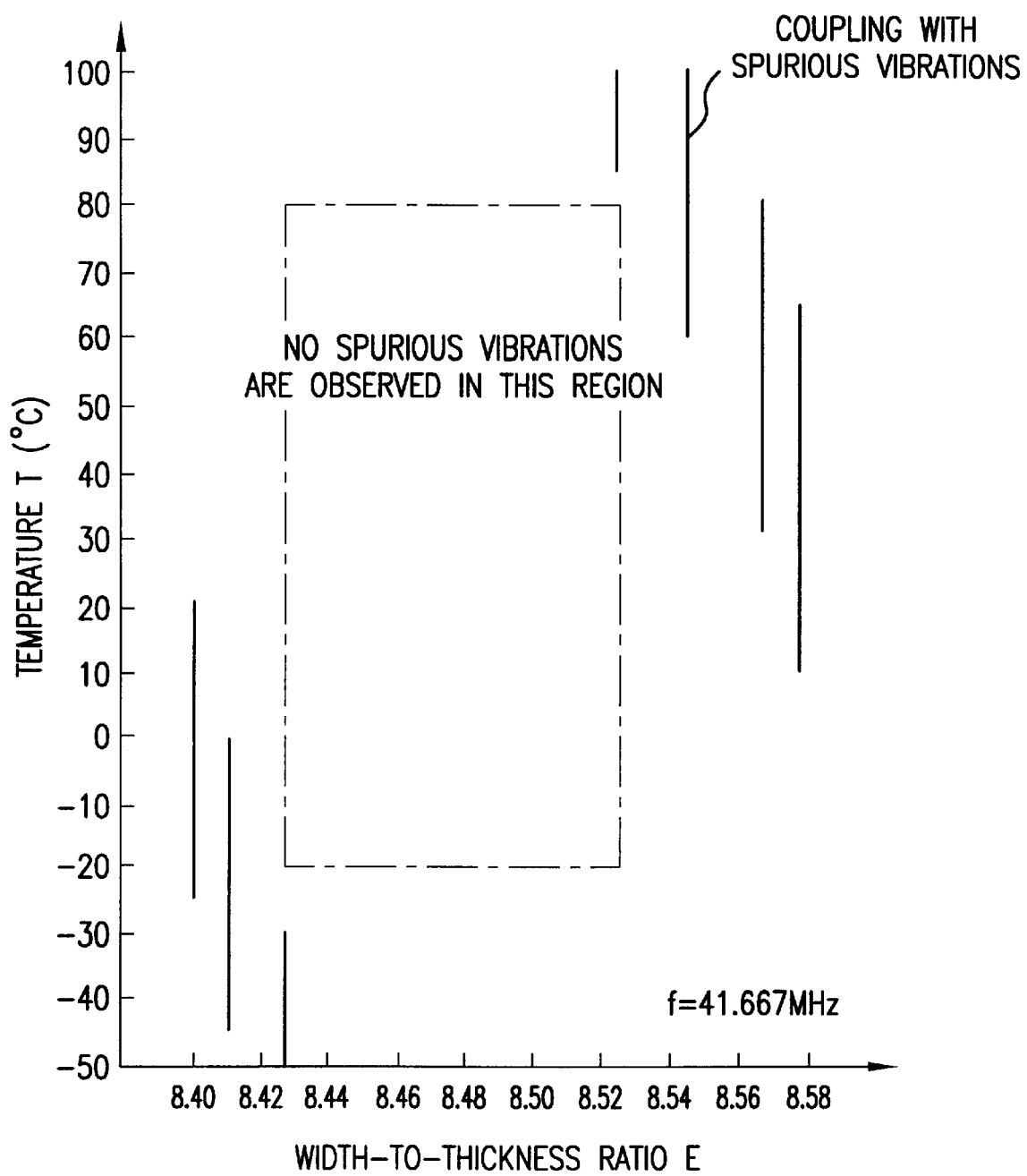
FIG. 10 is a graph illustrating the characteristic with respect to the coupling with spurious vibration for quartz resonator units fabricated using a quartz element having a width-to-thickness ratio E of about 8.48.

FIG. 10 summarizes the temperature characteristics of quartz resonator units having different width-to-thickness ratios close to 8.43, wherein solid lines represent such ranges in which coupling with the spurious vibrations is observed. As can be seen from FIG. 10, the experiments performed by the inventor of the present invention clearly show an optimum range of the width-to-thickness ratio of the quartz element in which the quartz resonator unit using the quartz element shows no coupling with the spurious vibrations over the required temperature range from −20° C. to +80° C. That is, the optimum range of the width-to-thickness ratio is 8.48+/−0.05, as represented by the area surrounded by the alternate long and short dash lines in FIG. 10.

EXAMPLE 3

Figure 11A:
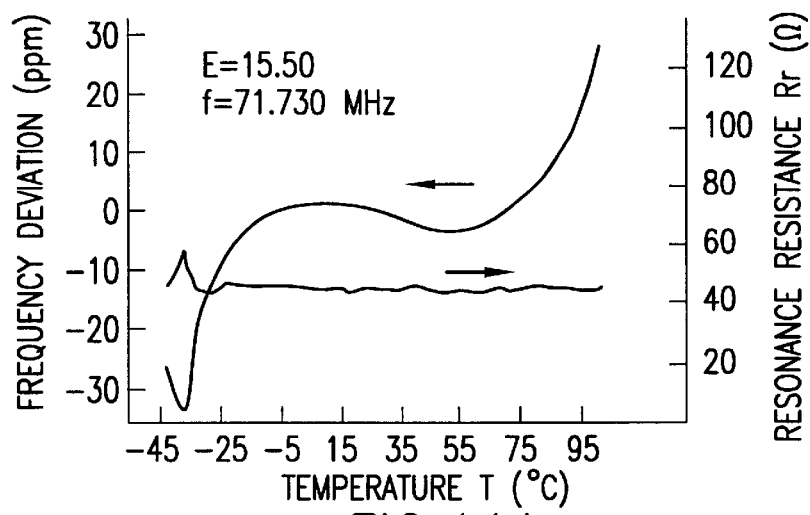
FIG. 11 is a graph illustrating temperature characteristics of quartz resonator units fabricated using a quartz element having a width-to-thickness ratio E of about 15.57.
Figure 11B:
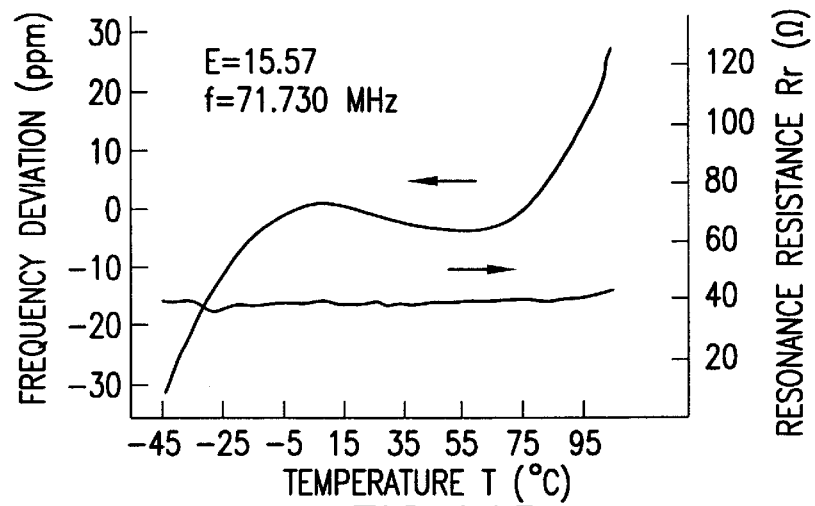

FIG. 11 shows the temperature characteristics of quartz resonator units, wherein one has a width-to-thickness ratio E of 15.57 and the others have a value close to 15.57 and wherein these quartz resonator units were fabricated according to the above-described fabrication method so that they oscillate at a frequency f of 71.730 MHz in the third-overtone mode. The length l of the quartz element used in these quartz resonator units is 4200 μm, and the width w is about 1080 μm, wherein the width w is adjusted as in the previous examples described above so that they oscillate at the given frequency. FIG. 11(b) shows the temperature characteristics of a quartz resonator unit having a quartz element with a width-to-thickness ratio of just 15.57. The characteristics with respect to both frequency deviation and resonance resistance Rr show that no other vibration modes occur, that is, no coupling with the spurious vibrations occurs over the temperature range from −45° C. to +95° C. The resonance resistance Rr has a value as low as about 40Ω and is substantially constant.

Figure 11C:
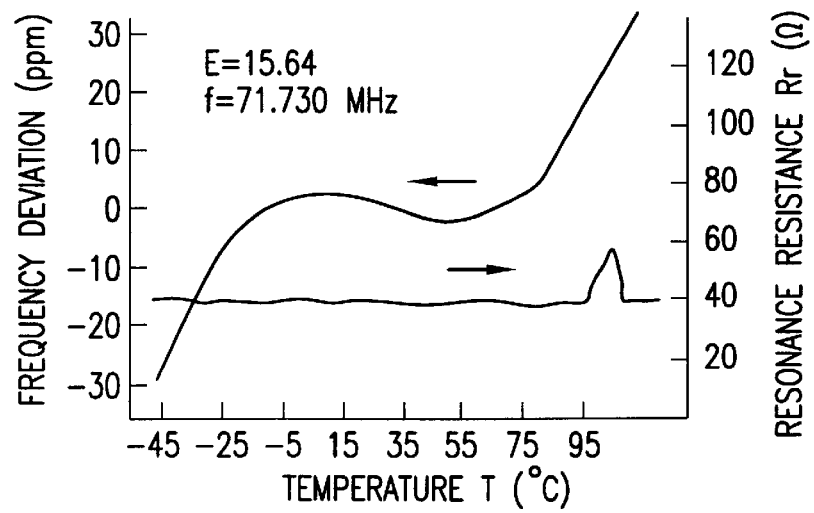

FIG. 11(a) shows the temperature characteristics of a quartz resonator unit having a quartz element with a width-to-thickness ratio of 15.50, and FIG. 11(c) shows the temperature characteristics of a quartz resonator unit having a quartz element with a width-to-thickness ratio of 15.64. These two samples were fabricated and evaluated in the same manner as the first one described above. In the temperature characteristics of the quartz resonator unit having the width-to-thickness ratio of 15.50, coupling with the spurious vibration is observed near −30° C. In the case of the quartz resonator unit having the width-to-thickness ratio of 15.64, on the other hand, coupling with the spurious vibration is observed at 90° C. or higher. Thus, if the width-to-thickness ratio of the quartz element is controlled in the range from 15.50 to 15.64, then stable oscillation can be achieved over the required temperature range, from −20° C. to +80° C., without coupling with the spurious vibrations.

Figure 12:
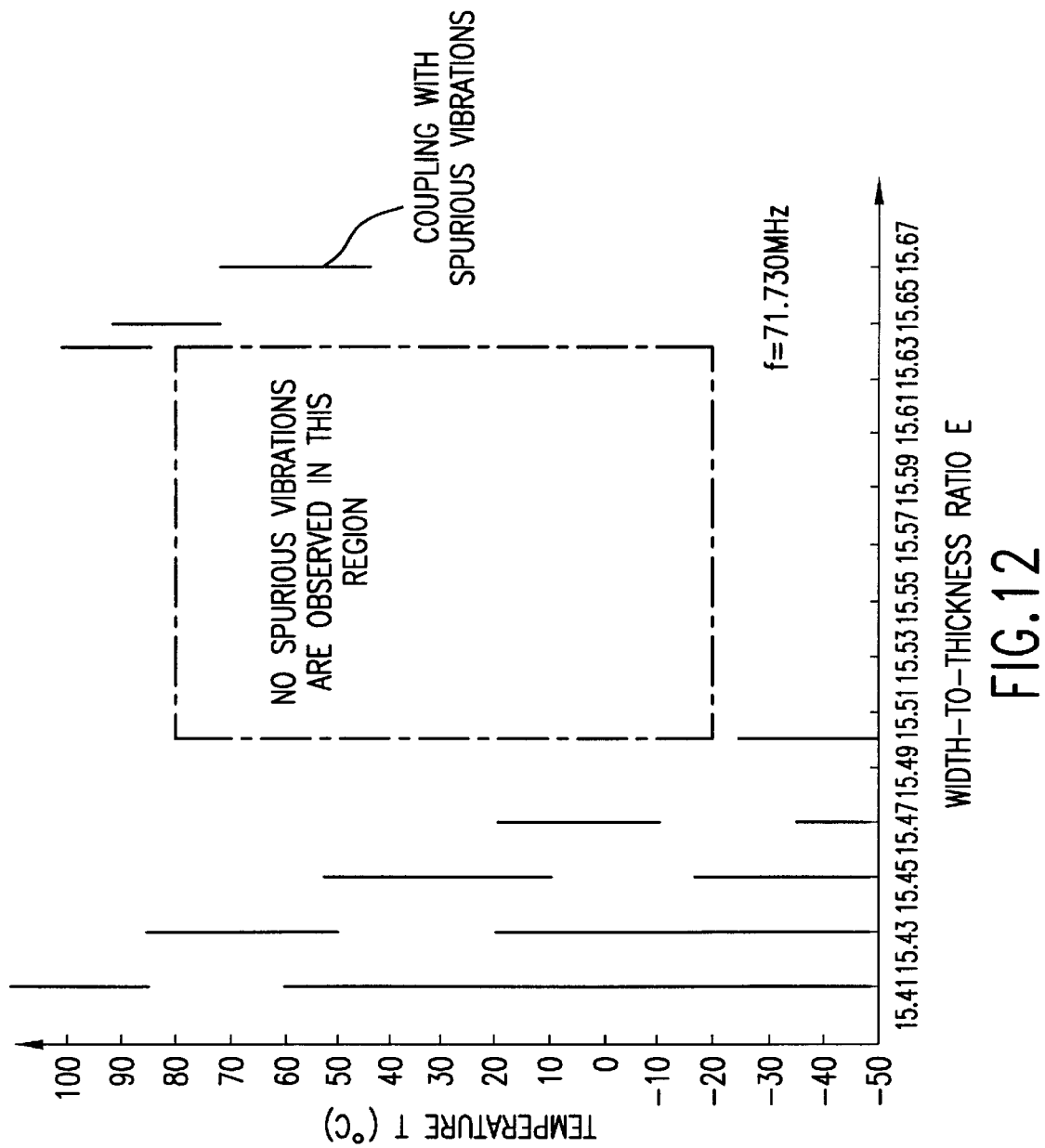
FIG. 12 is a graph illustrating the characteristic with respect to the coupling with spurious vibration for quartz resonator units fabricated using a quartz element having a width-to-thickness ratio E of about 15.57.

FIG. 12 summarizes the temperature characteristics of quartz resonator units having different width-to-thickness ratios close to 15.57, wherein solid lines represent such ranges in coupling with the spurious vibrations is observed. As can be seen from FIG. 12, the experiments performed by the inventor of the present invention clearly show an optimum range of the width-to-thickness ratio of the quartz element in which the quartz resonator unit using the quartz element shows no coupling with the spurious vibrations over the required temperature range from −20° C. to +80° C. That is, the optimum range of the width-to-thickness ratio is 15.57±0.07, as represented by the area surrounded by the alternate long and short dash lines in FIG. 12.

EXAMPLE 4

Figure 13:
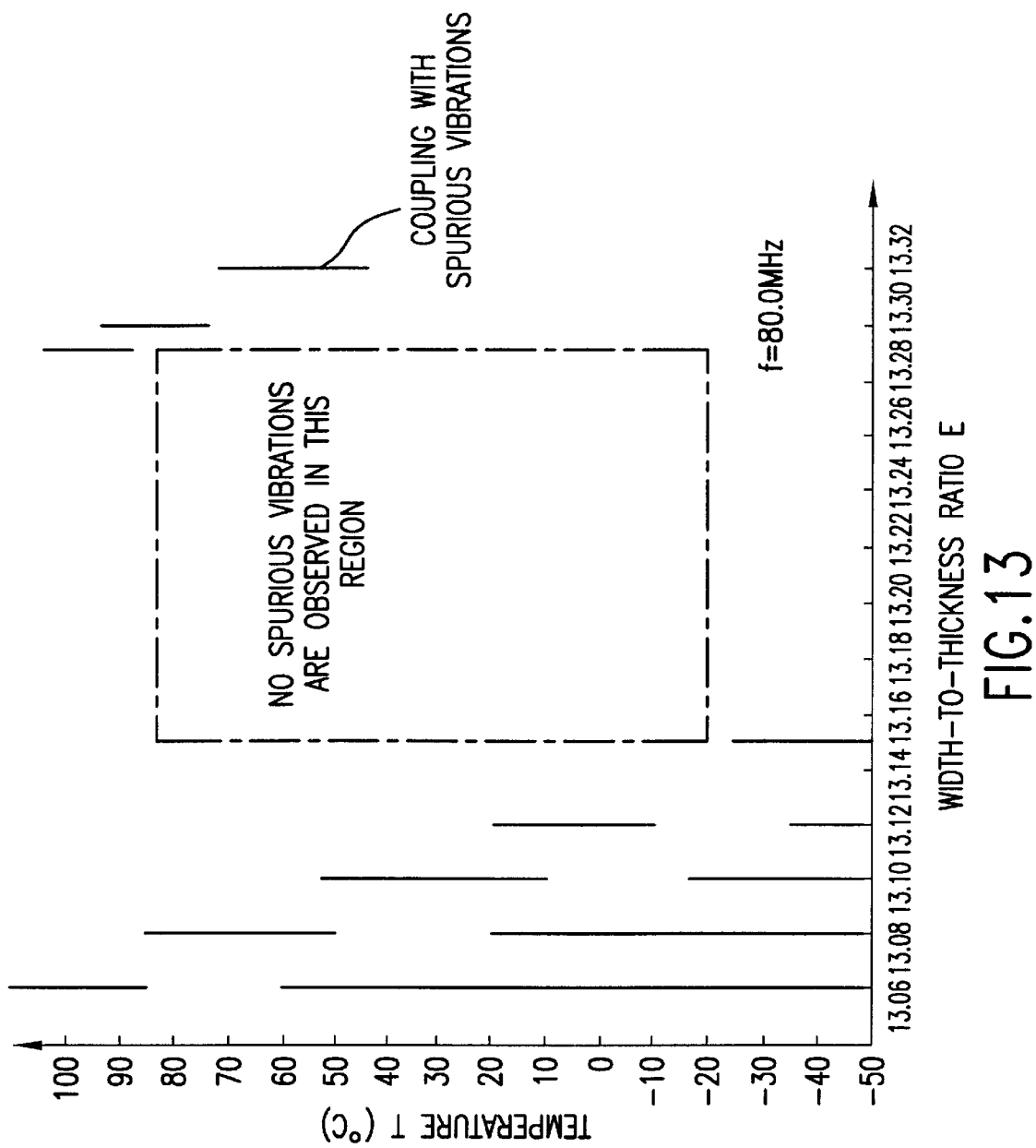
FIG. 13 is a graph illustrating the characteristic with respect to the coupling with spurious vibration for quartz resonator units fabricated using a quartz element having a width-to-thickness ratio E of about 13.22.

FIG. 13 summarizes the temperature characteristics of quartz resonator units provided with a quartz element having various width-to-thickness ratios E close to 13.22, and having a length l of 4200 μm and a width w of about 1100 μm, wherein the fine adjustment of the width w is performed so that they oscillate at a frequency of 60.0 MHz in the third-overtone mode. Also, in this range close to 13.22, as can be seen from FIG. 13, the experiments performed by the inventor of the present invention clearly show an optimum range of the width-to-thickness ratio E of the quartz element in which the quartz resonator unit using the quartz element shows no coupling with the spurious vibrations over the required temperature range from −20° C. to +80° C. That is, the optimum range of the width-to-thickness ratio is 13.22±0.07, as represented by the area surrounded by the alternate long and short dash lines in FIG. 13.

EXAMPLE 5

Figure 14:
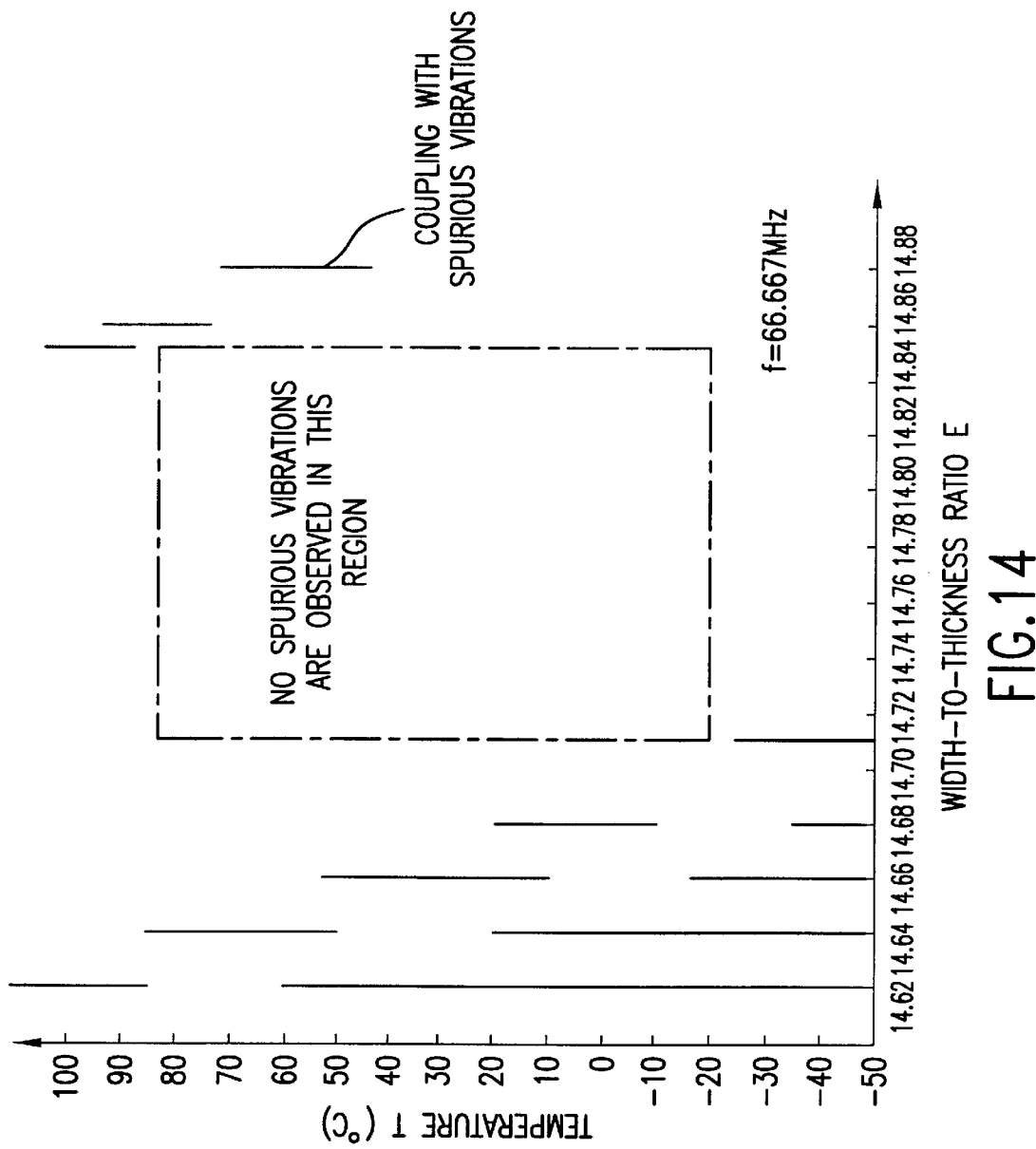
FIG. 14 is a graph illustrating the characteristic with respect to the coupling with spurious vibration for quartz resonator units fabricated using a quartz element having a width-to-thickness ratio E of about 14.78.

FIG. 14 summarizes the temperature characteristics of quartz resonator units provided with a quartz element having various width-to-thickness ratios E close to 14.78 and having a length l of 4200 μm and a width w of about 1110 μm, wherein the fine adjustment of the width w is performed so that they oscillate at a frequency of 66.667 MHz in the third-overtone mode. Again, in this range close to 14.78, as can be seen from FIG. 14, the experiments performed by the inventor of the present invention clearly show an optimum range of the width-to-thickness ratio E of the quartz element in which the quartz resonator unit using the quartz element shows no coupling with the spurious vibrations over the required temperature range from −20° C. to +80° C. That is, the optimum range of the width-to-thickness ratio is 14.78+/−0.07, as represented by the area surrounded by the alternate long and short dash lines in FIG. 14.

As described above, after performing experiments repeatedly, the inventor of the present invention has succeeded in achieving small-sized quartz elements, according to the fabrication method described earlier, that can be used in oscillation in the third-overtone mode without coupling with the spurious vibrations, by controlling the width-to-thickness ratio E in the specific ranges around the specific center values.

Figure 15:
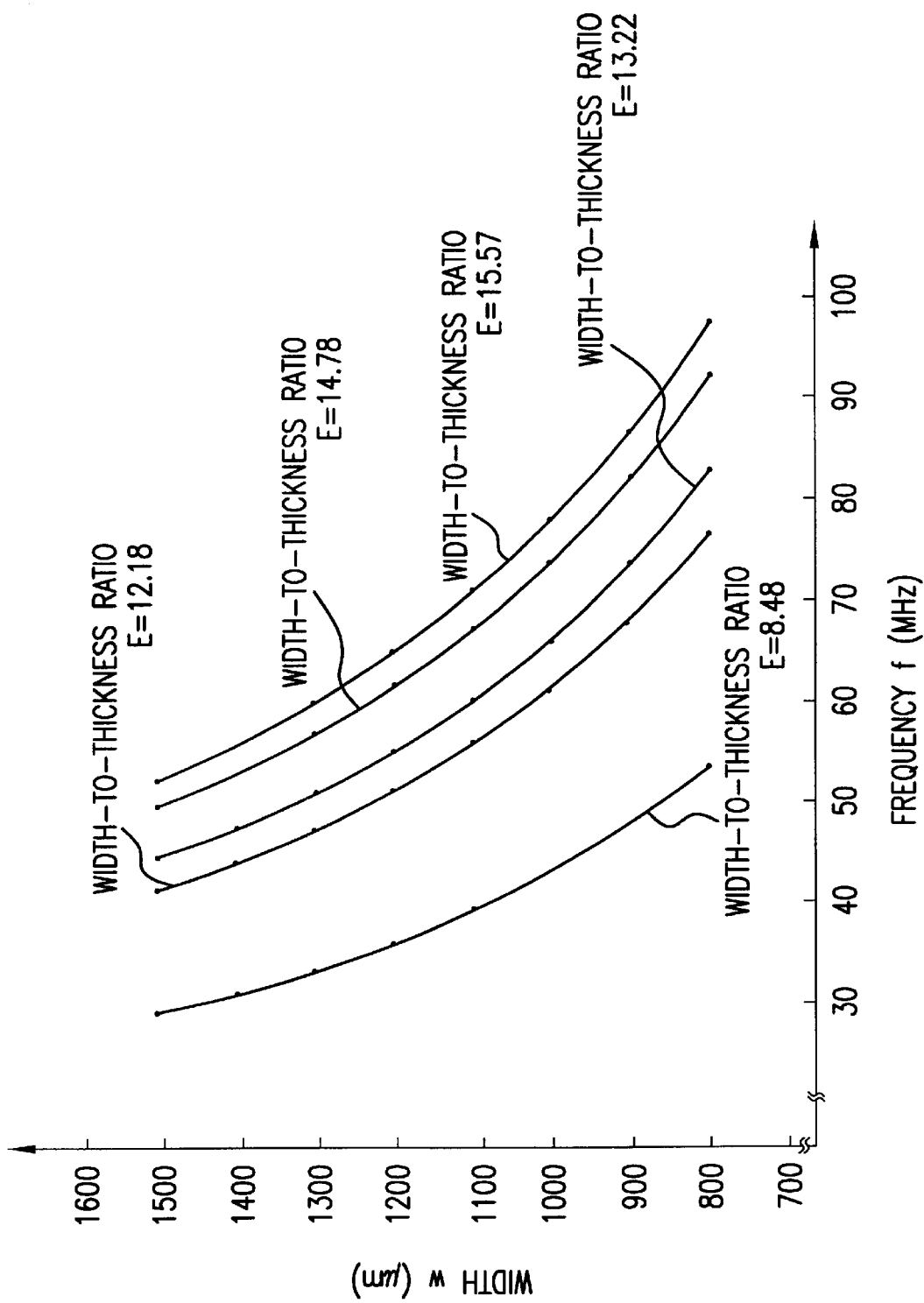
FIG. 15 is a graph showing frequency ranges that can be covered by quartz resonator units fabricated using a quartz element having a width-to-thickness ratio shown in the previous figures.

FIG. 15 illustrates the frequency ranges that can be covered by the quartz resonator units provided with a quartz element having dimensions small enough to be accommodated in a cylindrical holder with a diameter of 2 mm according to the embodiments of the present invention. From FIG. 15, it can be seen that a very wide range, from about 30 MHz to 90 MHz, can be completely covered by the quartz resonator units using a quartz element having a width in the range of 800 μm to 1500 μm and having a width-to-thickness ratio properly selected from the group consisting of 8.48, 12.18, 13.22, 14.78, and 15.57.

Influence of the Share on the Resonance Resistance Rr

From the experiments described above, the optimum ranges of width-to-thickness ratios that enable a small-sized rectangular AT-cut quartz element to stably oscillate in the overtone mode have been determined. Thus, the shape of quarts elements and other factors are studied to achieve a lower resonance resistance Rr, which is important to use the quartz resonator unit provided with such a quartz element in practical applications.

EXAMPLE 6

Figure 16:
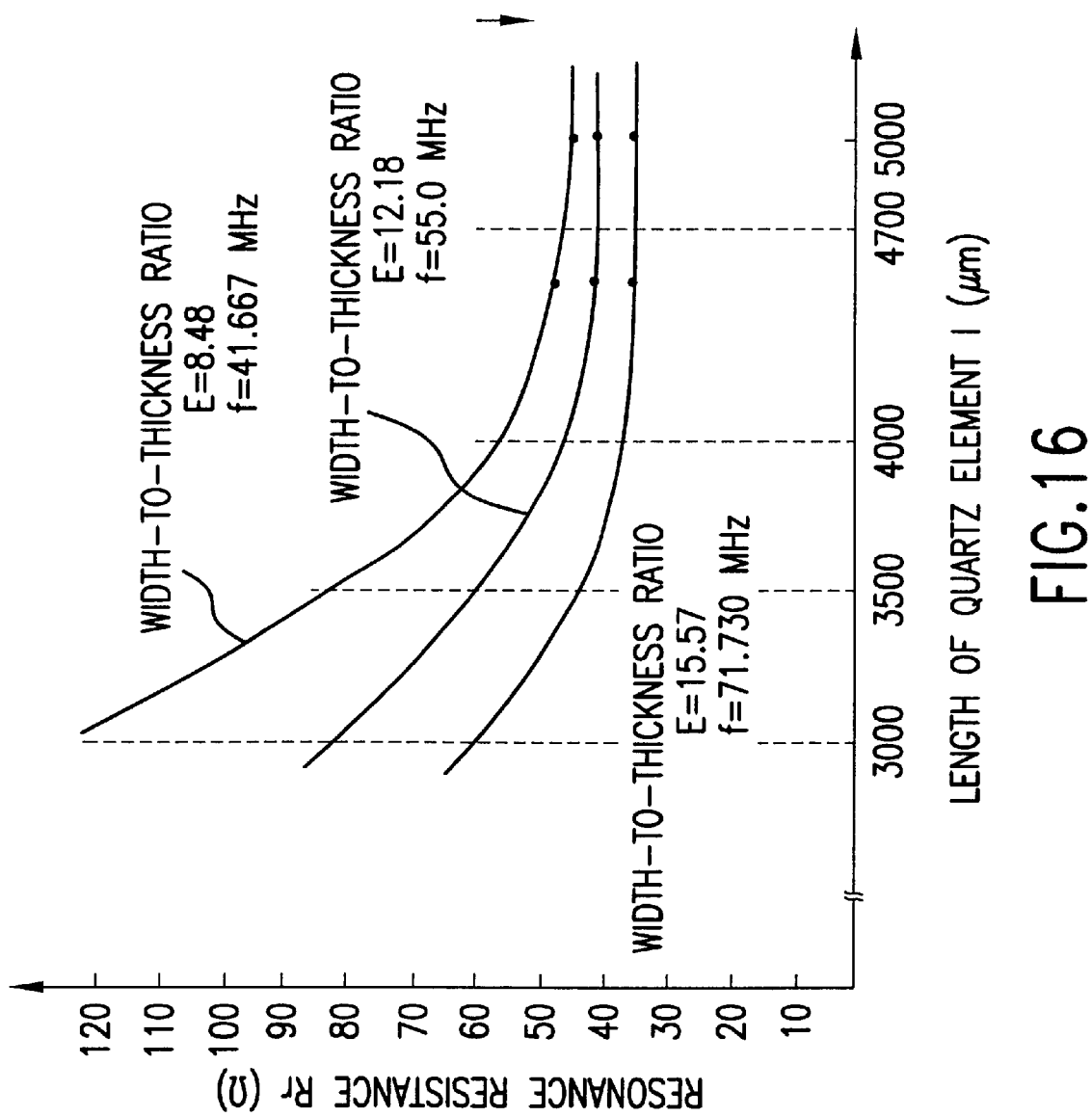
FIG. 16 is a graph illustrating the relationship between the length l and the resonance resistance Rr of a quartz element.

FIG. 16 summarizes the experimental results regarding the resonance resistance of a quartz resonator unit provided with a quartz element having various lengths l fabricated by the method described earlier. In this figure, the results are plotted for three typical values of width-to-thickness ratios E of the quartz element: 8.48, for use at a rather low frequency (f=41.667 MHz); 12.18, for use at an intermediate frequency (f=55.0 MHz); and 15.57, for use at a high frequency (f=71.730 MHz). The width w of each quartz element was adjusted so that the quartz resonator unit oscillates at a given frequency.

In general, a quartz resonator is designed to have a resonance resistance Rr of about 60Ω or less. As can be seen from FIG. 16, when the width-to-thickness ratio is 15.57, the above requirement with respect to the resonance resistance Rr can be met if the length l of the quartz element is greater than 3000 μm. In the case where the width-to-thickness ratio is 12.18, the above requirement with respect to the resonance resistance Rr can be met if the length l of the quartz element is greater than 3500 μm. In the case where the width-to-thickness ratio is 8.48, the requirement can be met if the length l of the quartz element is greater than 4000 μm. Thus, whatever width-to-thickness ratio of values described in the above examples 1–5 the quartz element has, the resonance resistance Rr will be low enough if the length l of the quartz element is greater than 4000 μm.

On the other hand, to accommodate the quartz element in a cylindrical holder having a length of about 6 mm, it is desired that the length l be less than about 4700 μm.

EXAMPLE 7

Figure 17:
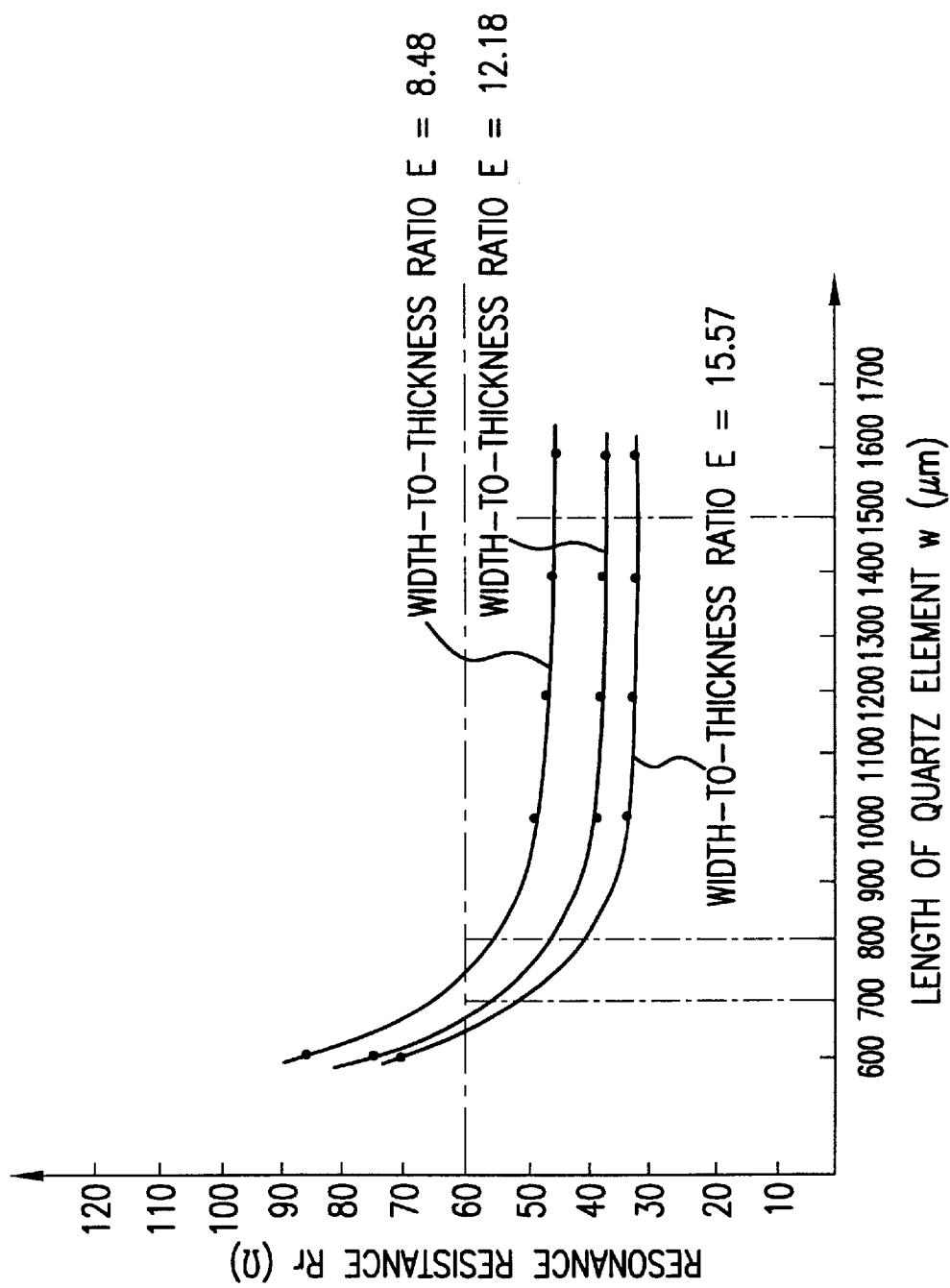
FIG. 17 is a graph illustrating the relationship between the width w and the resonance resistance Rr of a quartz element.

FIG. 17 illustrates the resonance resistance Rr of the quartz resonator units fabricated with a quartz element having various widths w, wherein quartz resonator units were fabricated according to the above-described method. In this figure, the results are plotted for three typical values of width-to-thickness ratio E of quartz element: 8.48, for use at a rather low frequency; 12.18, for use at an intermediate frequency; and 15.57, for use at a high frequency. The length l of the quartz element is fixed to 4200 μm.

As can be seen from FIG. 17, when the width-to-thickness ratio is 15.57 or 12.18, if a quartz element having a width w greater than 700 μm is used, then it is possible to achieve an excellent quartz resonator unit having a resonance resistance Rr smaller than 60Ω. In the case where the width-to-thickness ratio is 8.48, if the width w is greater than 800 μm, then the resonance resistance Rr will be smaller than 60Ω. Thus, whatever width-to-thickness ratio of values described in the above examples 1–5 the quartz element has, the resonance resistance Rr will be low enough if the width w of the quartz element is greater than 800 μm.

On the other hand, to accommodate the quartz element in a cylindrical holder having a diameter of about 2 mm, it is desired that the width w be less than about 1500 μm.

Influence of the Surface Roughness on the Resonance Resistance Rr

EXAMPLE 8

Figure 18:
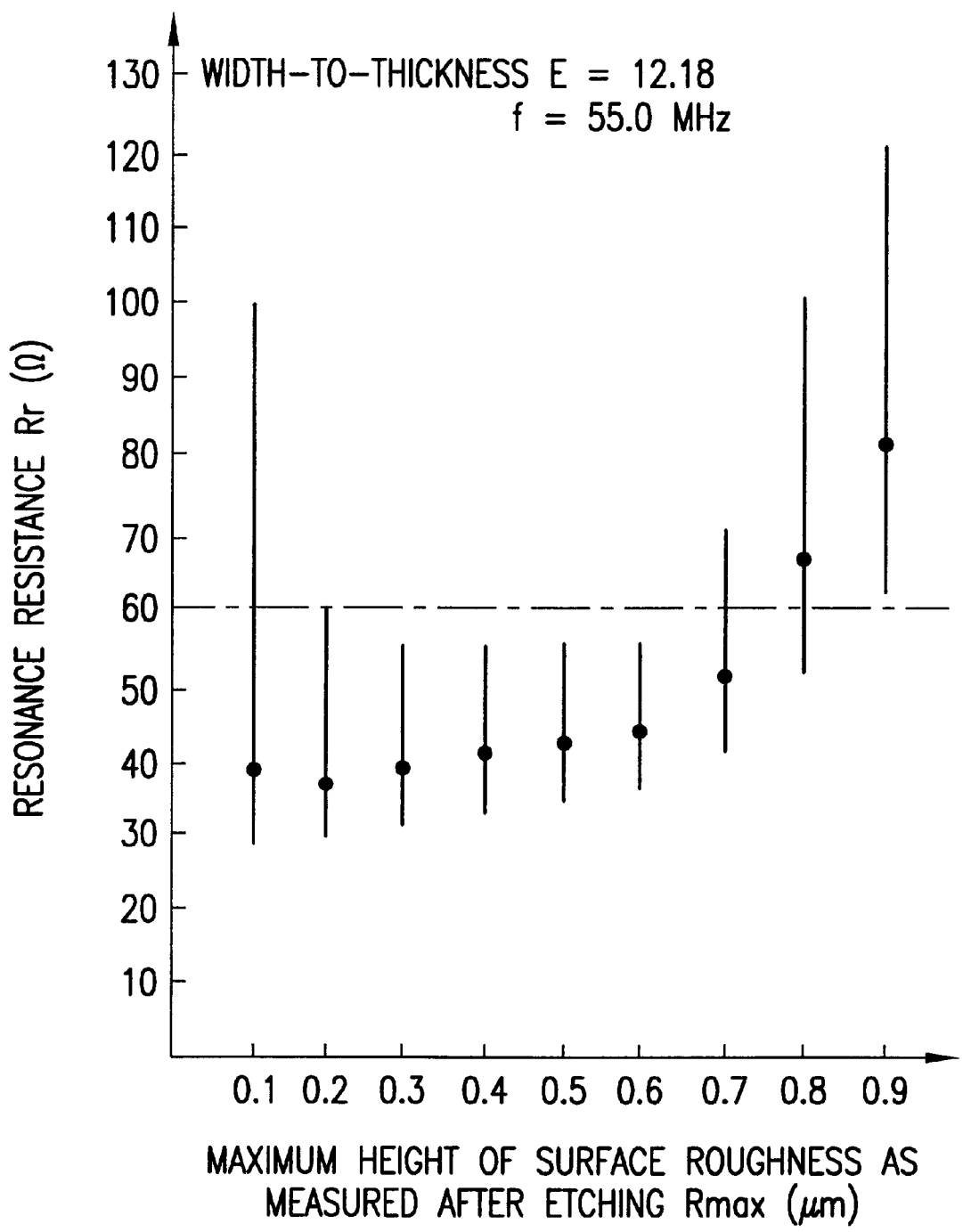
FIG. 18 is a graph illustrating the relationship between the resonance resistance Rr and the surface roughness of the etched surface of a quartz element having a width-to-thickness ratio E of 12.18.

FIG. 18 illustrates the relationship between the resonance resistance of the quartz resonator unit and the surface roughness of the quartz element used to fabricate the quartz resonator unit, wherein the surface roughness was evaluated just after the surface of the quartz element was etched. The width-to-thickness ratio E is 12.18, and the width w is adjusted so that the quartz resonator unit oscillates at 55.0 MHz in the third-overtone mode. The length l of each quartz element used is 4200 $\mu$m. In FIG. 18, the surface roughness is measured after the completion of the etching process in step 23 described earlier, wherein the surface roughness is evaluated by the maximum height of the surface roughness. However, the quartz element having a maximum height Rmax of 0.1 $\mu$m is fabricated by a process that differs from the above-described process used for the other samples in that the surface is polished before the etching process as in conventional techniques. In FIGS. 18, solid circles represent average values of resonance resistances Rr and the length of the solid lines represents the variations of the measured values.

From FIG. 18, it can be seen that although the samples with surfaces that were polished in the finish surface treatment process show low resonance resistances Rr, the resonance resistance Rr varies greatly from sample to sample, and some samples show values greater than 60$\Omega$. In contrast, the samples that were lapped in the finishing process show small variations in the resonance resistance Rr caused by the quartz element. If the maximum value Rmax of the surface roughness of the etched surface is in the range of 0.2 $\mu$m to 0.7 $\mu$m, it is possible to obtain a good resonance resistance Rr less than about 60$\Omega$, including the variation from element to element. If the maximum value Rmax of the surface roughness of the etched surface is in the range of 0.3 $\mu$m to 0.6 $\mu$m, it is possible to obtain a better resonance resistance Rr less than 60$\Omega$, including the variation from element to element.

EXAMPLE 9

Figure 19:
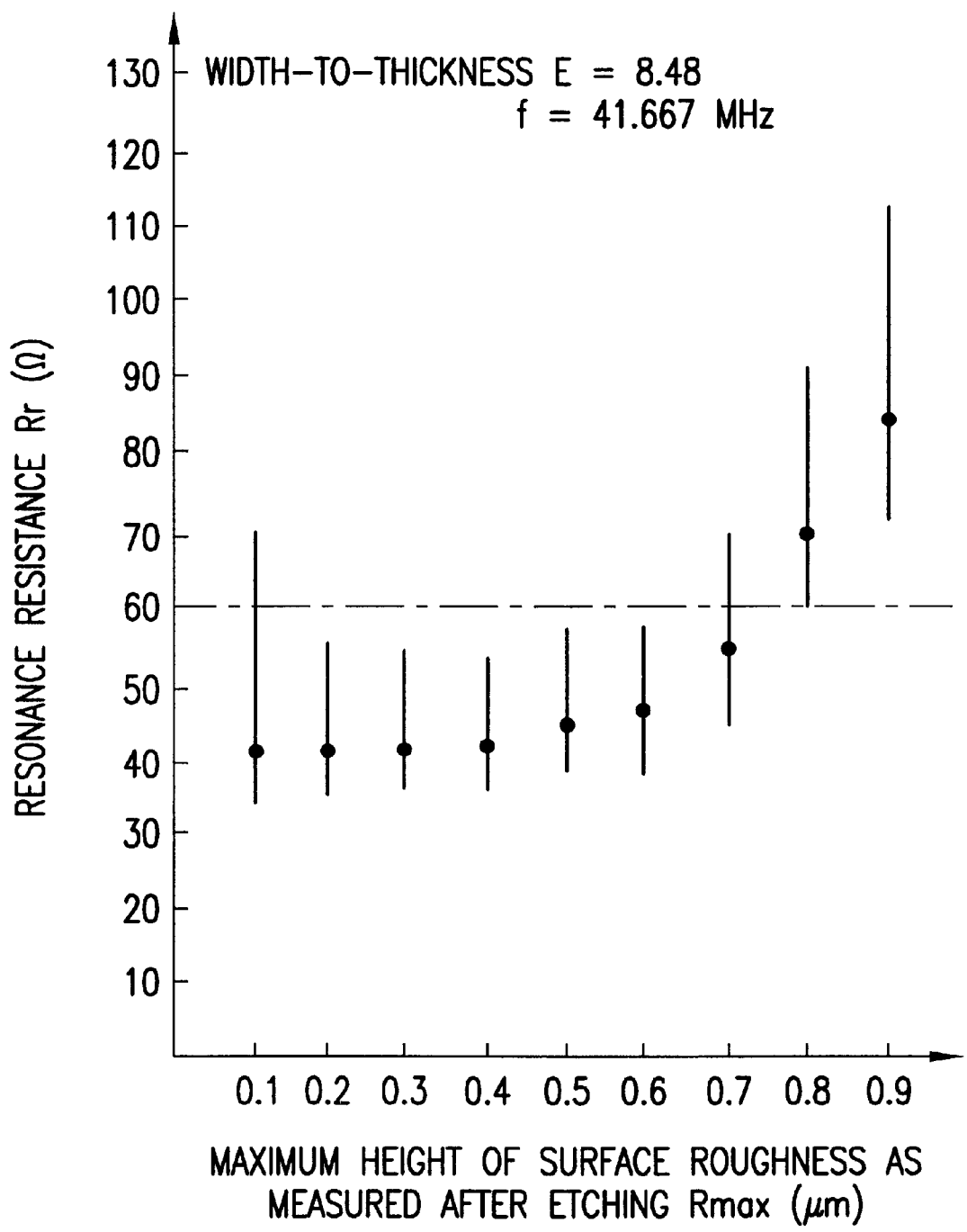
FIG. 19 is a graph illustrating the relationship between the resonance resistance Rr and the surface roughness of the etched surface of a quartz element having a width-to-thickness ratio E of 8.48.

FIG. 19 also illustrates the relationship between the resonance resistance of the quartz resonator unit and the surface roughness evaluated after the surface etching of the quarts element used to fabricate the quartz resonator unit. In this case, the width-to-thickness ratio E is 8.48, and the width w is adjusted so that the quartz resonator unit oscillates at 41.667 MHz in the third-overtone mode. The length l of each quartz element used is 4200 $\mu$m.

Also in this case, as can be seen from the experimental results shown in FIG. 19, although the samples that were subjected to the finish polishing process have low resonance resistances Rr, the resonance resistance Rr varies greatly from sample to sample, and many samples have values greater than 60$\Omega$. In contrast, the samples that were lapped in the finishing process have small variations in the resonance resistance Rr caused by the quartz element. If the maximum value Rmax of the surface roughness of the etched surface is in the range of 0.2 $\mu$m to 0.7 $\mu$m, it is possible to obtain a good resonance resistance Rr less than about 60$\Omega$, including the variation from element to element. If the maximum value Rmax of the surface roughness of the etched surface is in the range of 0.3 $\mu$m to 0.6 $\mu$m, it is possible to obtain a better resonance resistance Rr less than 60$\Omega$, including the variation from element to element.

EXAMPLE 10

Figure 20:
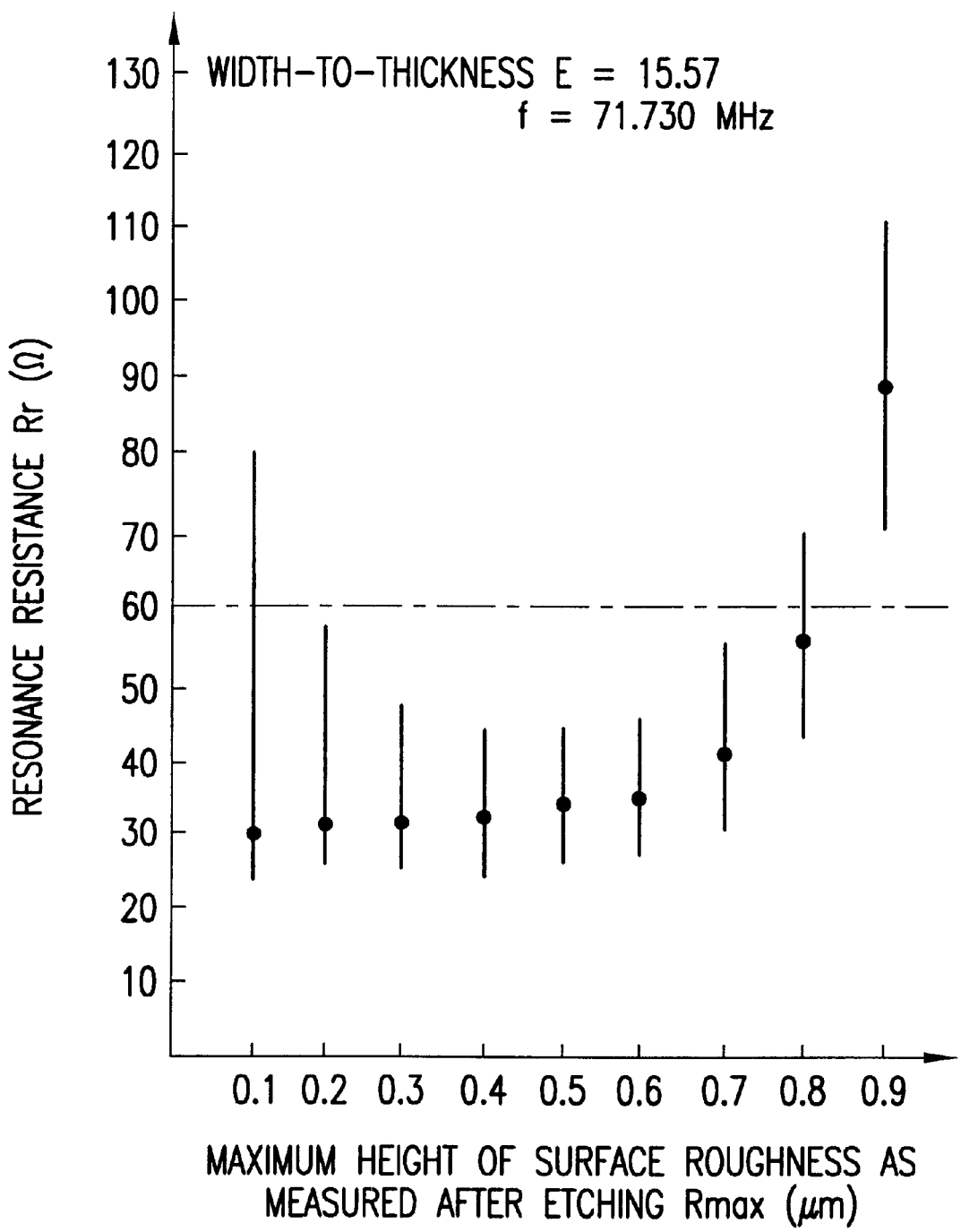
FIG. 20 is a graph illustrating the relationship between the resonance resistance Rr and the surface roughness of the etched surface of a quartz element having a width-to-thickness ratio E of 15.57.

FIG. 20 illustrates the relationship between the resonance resistance of the quartz resonator unit and the surface roughness evaluated after the surface etching of the quarts element used to fabricate the quartz resonator unit for the case where the width-to-thickness ratio E is 15.57, and the width w is adjusted so that the quartz resonator unit oscillates at 71.730 MHz in the third-overtone mode. The length l of each quartz element used is 4200 $\mu$m.

Again in this case, as can be seen from FIG. 20, although the samples that were subjected to the finish polishing process have low resonance resistances Rr, the resonance resistance Rr varies greatly from sample to sample, and many samples have values greater than 60$\Omega$. In contrast, the samples that were lapped in the finishing process have small variations in the resonance resistance Rr caused by the quartz element. If the maximum value Rmax of the surface roughness of the etched surface is in the range of 0.2 $\mu$m to 0.7 $\mu$m, it is possible to obtain a good resonance resistance Rr less than about 60$\Omega$, including the variation from element to element. If the maximum value Rmax of the surface roughness of the etched surface is in the range of 0.3 $\mu$m to 0.6 $\mu$m, it is possible to obtain a better resonance resistance Rr less than 60$\Omega$, including the variation from element to element.

From the experimental results described above, it can be concluded that to obtain high-performance quartz resonator units having not only a low resonance resistance Rr, but also a small variation in the resonance resistance from element to element, it is preferable that the surface treatment be performed such that the resultant surface roughness be in the above-described specific range, as opposed to conventional techniques in which the surface is processed so that the resultant surface roughness becomes as flat as possible.

In the conventional techniques to produce small-sized quartz elements, in particular those used as overtone quartz elements, the surface processing is performed such that the resultant surface roughness becomes as small as possible to suppress irregular reflection of the vibration occurring at the surface of quartz elements thereby improving the excitation efficiency. From this point of view, the surface roughness of the quartz element is controlled such that the maximum height Rmax becomes less than 0.2 $\mu$m or 0.1 $\mu$m. Particularly in production of small-sized quartz elements, the polishing process was considered essential to prevent the leakage of the vibrations.

Polishing is a costly and time-consuming process that needs an expensive polishing abrasive. Moreover, although it is possible to obtain a surface with small roughness by employing the polishing process, it is difficult to obtain a non-sloped surface. There are wavy irregularities on the surface processed by the polishing. Thus, the polishing requires high skill. If a polished surface of a quartz element comes into contact with a polished surface of another quartz element, it becomes difficult to separate them from each other. Furthermore, the polished surface is difficult to handle because the polished surface can be damaged very easily and thus degradation in surface flatness easily occurs.

In contrast, in the present invention, the finish surface treatment is performed by means of lapping so that the resultant surface roughness becomes preferably in the range of 0.2 $\mu$m to 0.7 $\mu$m or more preferably in the range of 0.3 $\mu$m to 0.6 $\mu$m thereby achieving quartz resonator units having a low resonance resistance Rr and also having a small-variation in the resonance resistance Rr from element to element. Thus, it is possible to produce high-performance quartz resonator units with a high production yield. In production of such high-performance quartz resonator units according to the present invention, the polishing process is not necessary, which means that small-sized quartz elements can be produced without using the time-consuming polishing process that needs high skill, and therefore it is possible to provide high-performance quartz resonator units at a low cost.

Figures 21A, 21B:
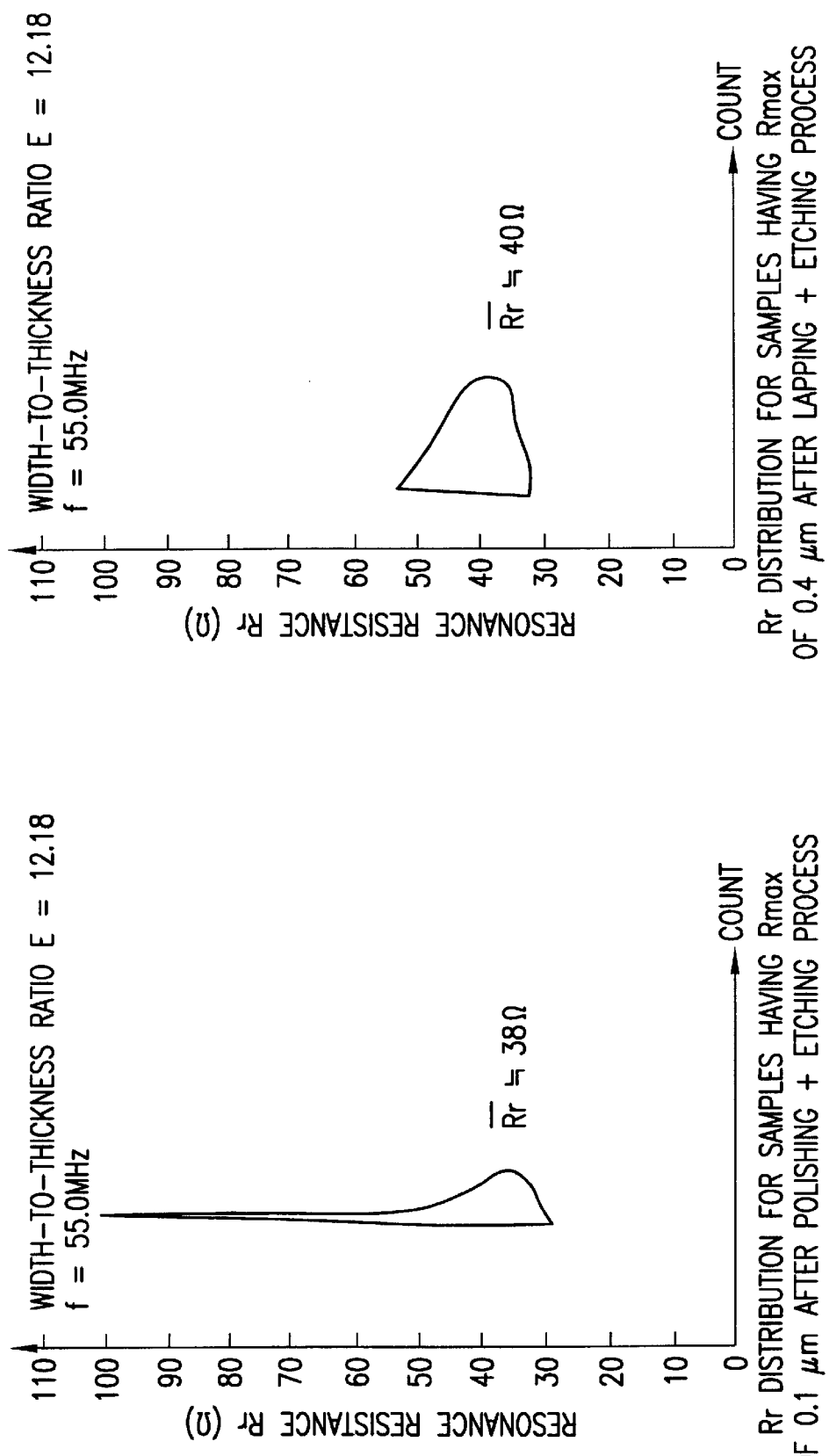
FIG. 21 is a graph illustrating the variations in resonance resistance Rr for two groups of the quartz elements: one is etched after polishing and the other is etched after lapping.

FIG. 21 is a graph showing, in an enlarged fashion, the distribution of the resonance resistance Rr for the quartz resonator units described in Example 8, fabricated using a quartz element with a measured value of width-to-thickness ratio E of 12.18. In the case where the surface is etched after the polishing so that the maximum height of the surface roughness becomes about 0.1 μm, although the average value of the resonance resistance Rr is as low as 38Ω, some samples have a very high resonance resistance, such as 100Ω. In contrast, in the case where the surface is etched after lapping so that the maximum height of the surface roughness becomes about 0.4 μm, not only is the average value of the resonance resistance Rr as low as 40Ω, but also the maximum value of the resonance resistance Rr is as low as 50Ω.

Furthermore, the thickness of the polished quartz element varies greatly. Therefore, it is required to adjust the oscillation frequency by means of etching. The polished surface is easily contaminated and damaged during the removing, cleaning, and drying processes. If the surface with such contamination or damage is etched, the contaminated or damaged surface portions are not etched and thus remain as etch pits. Furthermore, the damage or defects are enlarged, which results in irregularities on the surface. As a result, the resonance resistance Rr becomes greater.

In contrast, if the surface is etched after lapping, it is possible to obtain a small value in Rmax and a small variation in the surface roughness. Thus, the variation in the resonance resistance Rr is small, and it is possible to produce quartz elements with a high production yield. In addition to quartz elements, the present invention can also be advantageously applied to other devices, such as ceramic resonators, in which the surface vibrations are reflected and trapped.

The variation in the thickness of the lapped quartz element is smaller than that of the polished quartz element, and thus the variation in the oscillation frequency of the lapped quartz element is also smaller. In the case where the surface is lapped, since the variation in the resonance resistance is not expanded by the etching process following the lapping process, if the lapped quartz elements are grouped in several classes according to the oscillation frequency, and the quartz elements in each groups are etched for a proper time depending on the oscillation frequency, then it becomes possible to further reduce the variation in the frequency.

EXAMPLE 11

Figure 22:
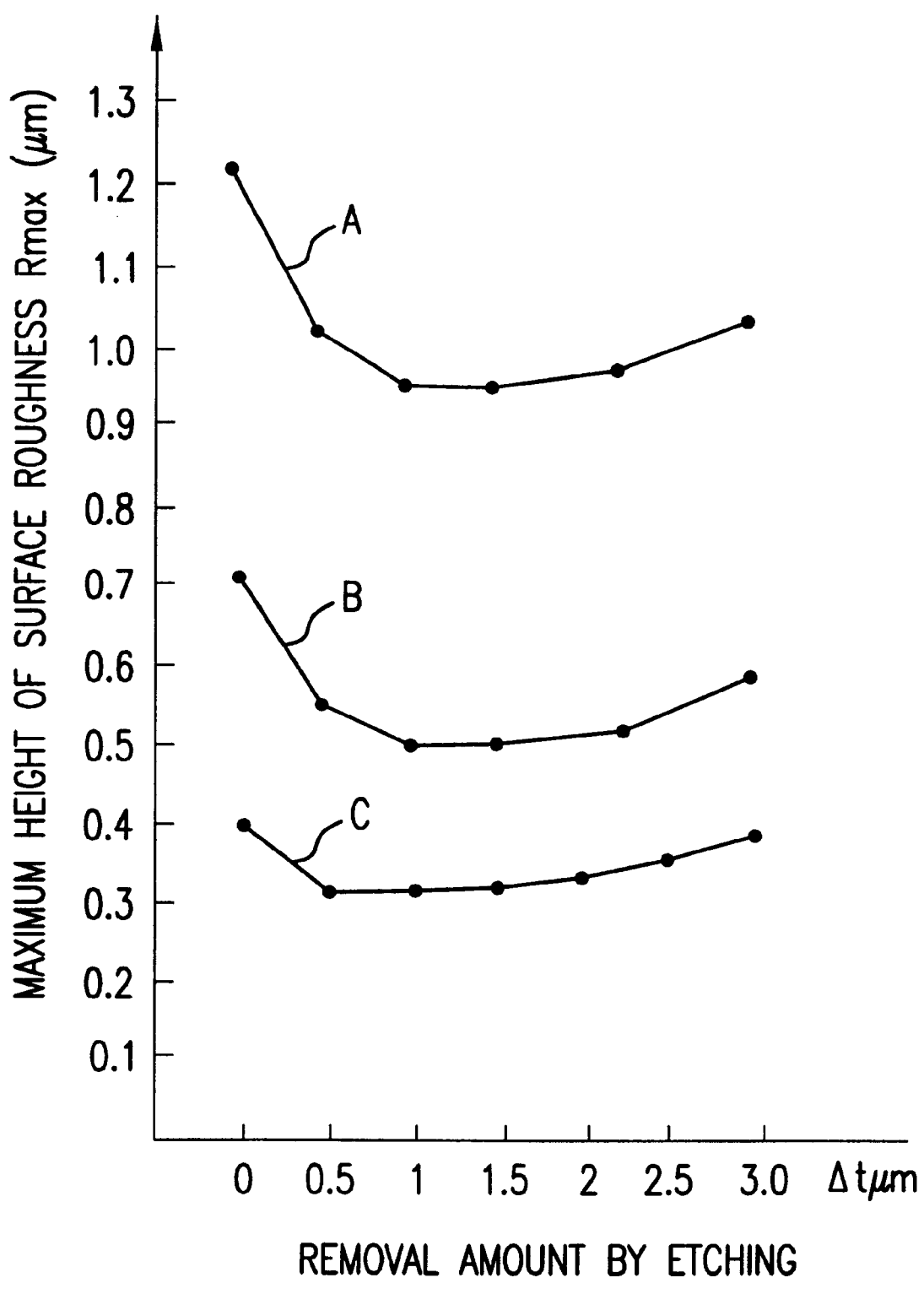
FIG. 22 is a graph illustrating the relationship between the surface roughness and the etched thickness of a quartz element.
Figure 23:
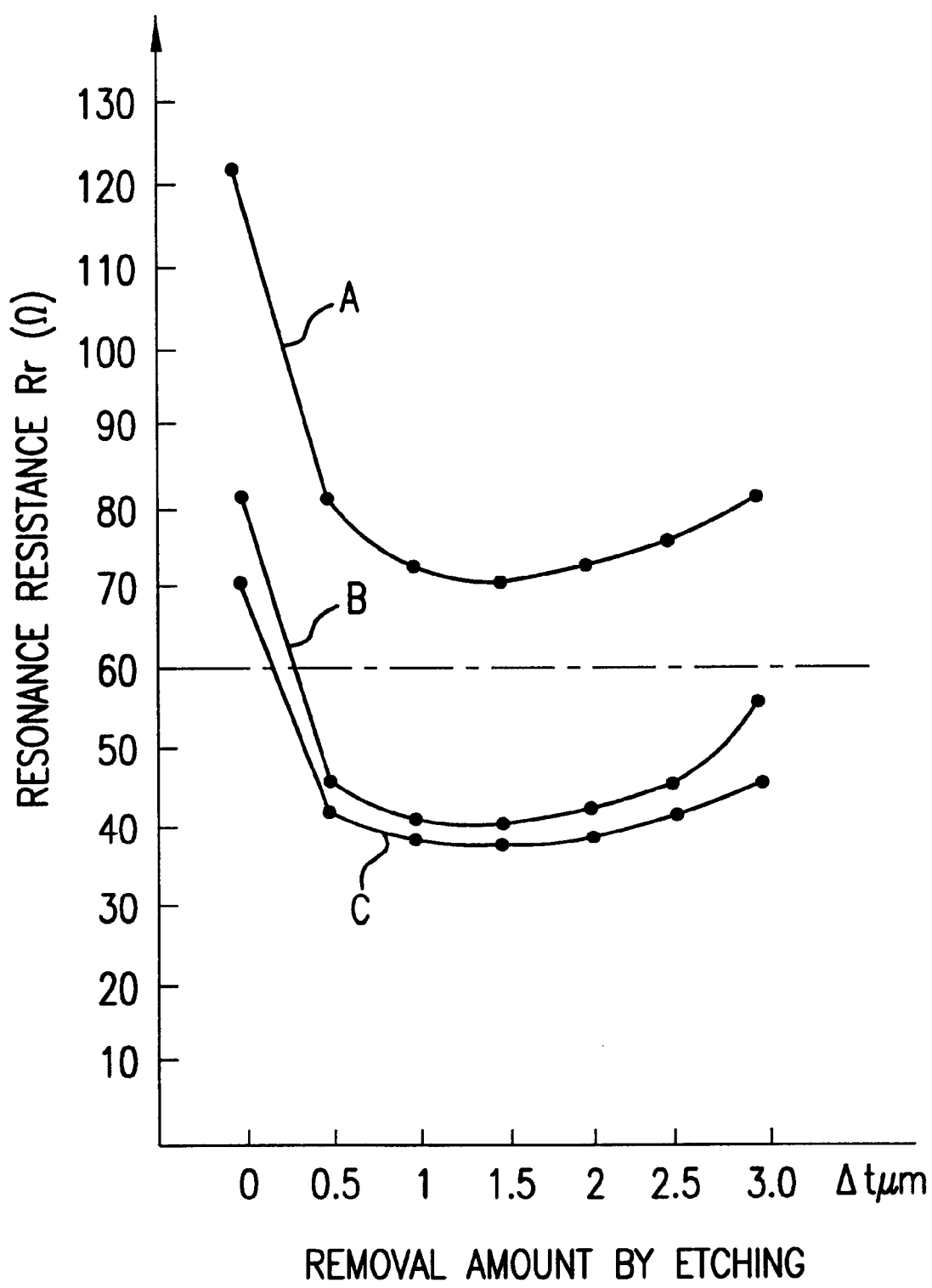
FIG. 23 is a graph illustrating the relationship between the etched thickness and the resonance resistance Rr.

FIG. 22 illustrates the change in the surface roughness occurring during the process in which the lapped surface is etched, wherein the change is plotted as a function of the etched amount. FIG. 23 illustrates the change in the resonance resistance Rr occurring during the process in which the lapped surface is etched, wherein the change is also plotted as a function of the etched amount. These samples all have the same width-to-thickness ratio of 12.18, while the width w was adjusted so that they oscillate at 55.0 MHz. The length l of the quartz elements used is 4200 μm. In FIGS. 22 and 23, the changes in the surface roughness and the resonance resistance Rr are plotted for samples having three different values of the maximum height Rmax of the surface roughness: 1.2 μm (A), 0.7 μm (B), and 0.4 μm (C), wherein the surface roughness was measured just before the etching process. Each value of resonance resistances Rr plotted in the figures represents the average of a plurality of measured values. The etching was done using a 10–30 wt % hydrofluoric acid etchant as described earlier.

From FIG. 22, it can be seen that in the range where the etched amount is less than about 0.5 μm, the maximum height Rmax decreases rapidly as the etched amount increases. This fact suggests that the surface layer that was damaged greatly during the lapping process is removed by etching. In the range where the etched amount is 0.5 μm to 2.5 μm, no great change in the surface roughness is observed, which suggests that defects having stable structure remaining in the surface layer are gradually removed by etching. On the other hand, in the range where the etched amount is greater than 2.5 μm, the maximum height Rmax of the surface roughness increases with the etched amount. This is probably due to the variation in the etching rate depending on the crystal orientation of a single-crystal quartz. The dependence of the etching rate on the crystal orientation creates the great irregularities on the surface of quartz elements and thus causes the increase in Rmax.

As shown in FIG. 23, the resonance resistance changes in a similar fashion to that in the case of the maximum height Rmax of the surface roughness shown in FIG. 22. That is, in the range where the etched amount is less than 0.5 μm, the resonance resistance Rr decreases rapidly as the etched amount increases. In the range where the etched amount is 0.5 μm to 2.5 μm, no great change in the resonance resistance Rr is observed. However, in the range where the etched amount is greater than 2.5 μm, the resonance resistance Rr increases greatly with the etched amount. From the experimental results described above, it can be concluded that it is preferable that the surface of the quarts element be etched after the lapping, by the amount in the range from 0.5 μm to 2.5 μm, to obtain a high-quality quartz element having a low resonance resistance Rr with a small variation. If the removal amount per surface in the etching process is controlled in the above-described range, great damage or defects generated during the cutting and lapping processes of the quartz element are removed, and thus, stable structure appears at the surface of the quartz element, which results in a low resonance resistance Rr with a small variation.

Furthermore, as can be seen from FIG. 23, to obtain a low resonance resistance Rr less than 60Ω in the quartz element according to the present invention, it is desirable that the maximum height of the surface roughness measured before the etching process be less than 0.7 μm. Taking the degree of the surface roughness of the quart element obtained by the finish lapping process into consideration, it is desirable that the maximum height of the surface roughness measured before the etching process be in the range from 0.3 μm to 0.7 μm to produce quartz elements having a low resonance resistance Rr with a small variation. In the embodiment of the invention, the surface of the quartz element can be lapped into a desired flatness described above using an alumina-based abrasive having an average grain size of 2.5 μm to 3.0 μm.

The Effect of the Electrode

To obtain a quartz resonator having good characteristics after forming electrodes on a quartz element, it is important to properly select the size of electrodes and the thickness of the electrode film. If the electrode size is too small, then the energy is not trapped sufficiently and the resonance resistance Rr increases. On the other hand, if the electrodes extend to positions very near the edges of a quartz element, spurious vibrations occur resulting from the edges, which causes degradation in the temperature characteristics or results in an increase in the resonance resistance Rr. However, in small-sized quartz elements for use in third-overtone oscillation concerned here in the present invention, the influence of the size and thickness of electrodes on the resonance resistance Rr was not known.

EXAMPLE 12

FIG. 24 illustrates the temperature characteristics of the quartz element for various electrode sizes, wherein each quartz element is fabricated according to the above-described method such that it has a width-to-thickness ratio of 12.18, a width w of 1109 μm, and a length l of 4200 μm, so that it oscillates at 55.0 MHz. The electrodes are formed on both surfaces of the quartz element as described earlier referring to FIG. 3. In this example, more specifically, the electrodes were formed by evaporating chromium and silver. There were prepared various samples having different spaces D between each edge of the width of the quartz element and each edge of the width of the electrode. Using these quartz elements, quartz resonator units were fabricated, and the temperature characteristics of the obtained quartz resonator units were measured with the measurement system MODEL 2100 produced by Sunders Co.

Figure 24A:
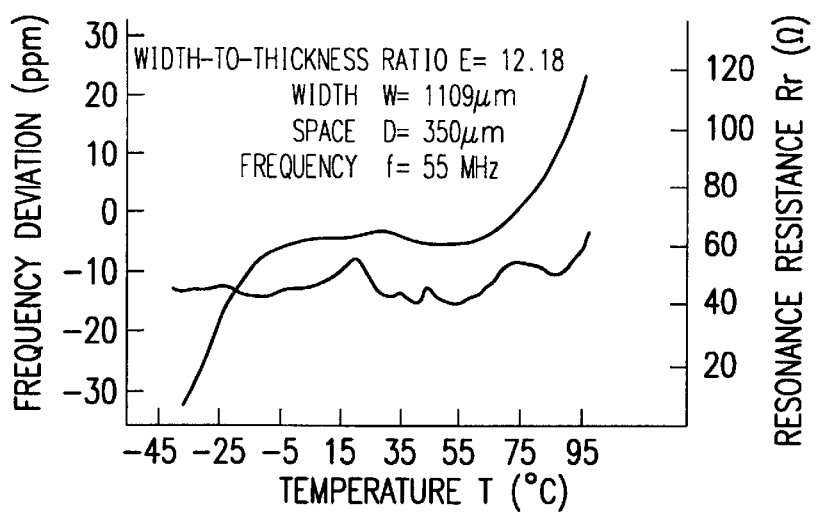
FIG. 24 is a graph illustrating the temperature characteristics of quartz resonator units fabricated using a quartz element having a width-to-thickness ratio E of 12.18, for various spaces D.
Figure 24B:
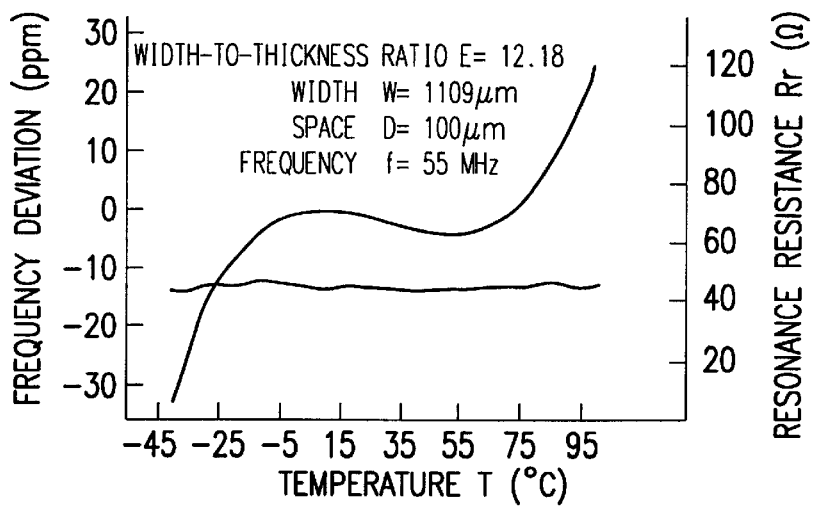

As shown in FIG. 24(b), the sample having a space D of 100 μm exhibits a stable frequency-temperature characteristic in the form of a cubic curve over the entire temperature range. This sample also shows a good resonance resistance Rr having a nearly constant value of 40Ω over the entire temperature range.

Figure 24C:
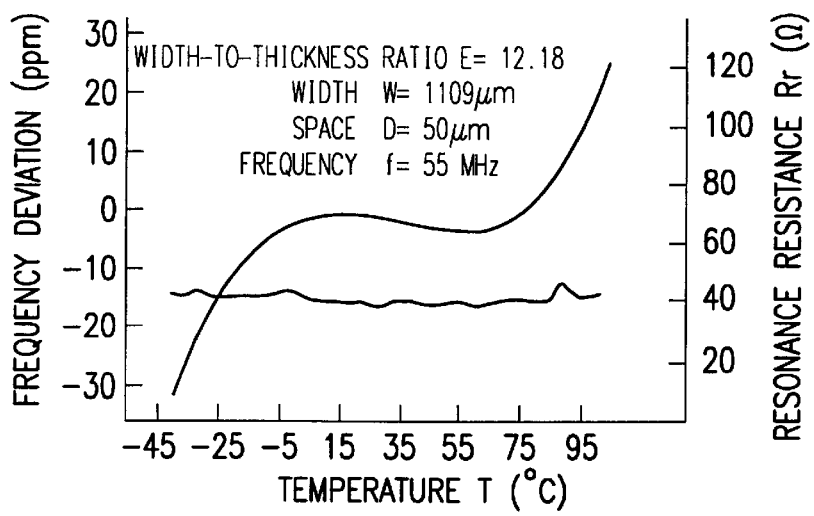

In contrast, the sample having a space D of 350 μm shows unstable characteristics in both frequency and resonance resistance Rr over the entire temperature range, as illustrated in FIG. 24(a). This can be explained by the insufficient energy trapping due to the small area of the electrode. On the other hand, the sample having a space D of 50 μm shows coupling with spurious vibrations at temperatures near 80° C., as illustrated in FIG. 24(c).

Figure 27:
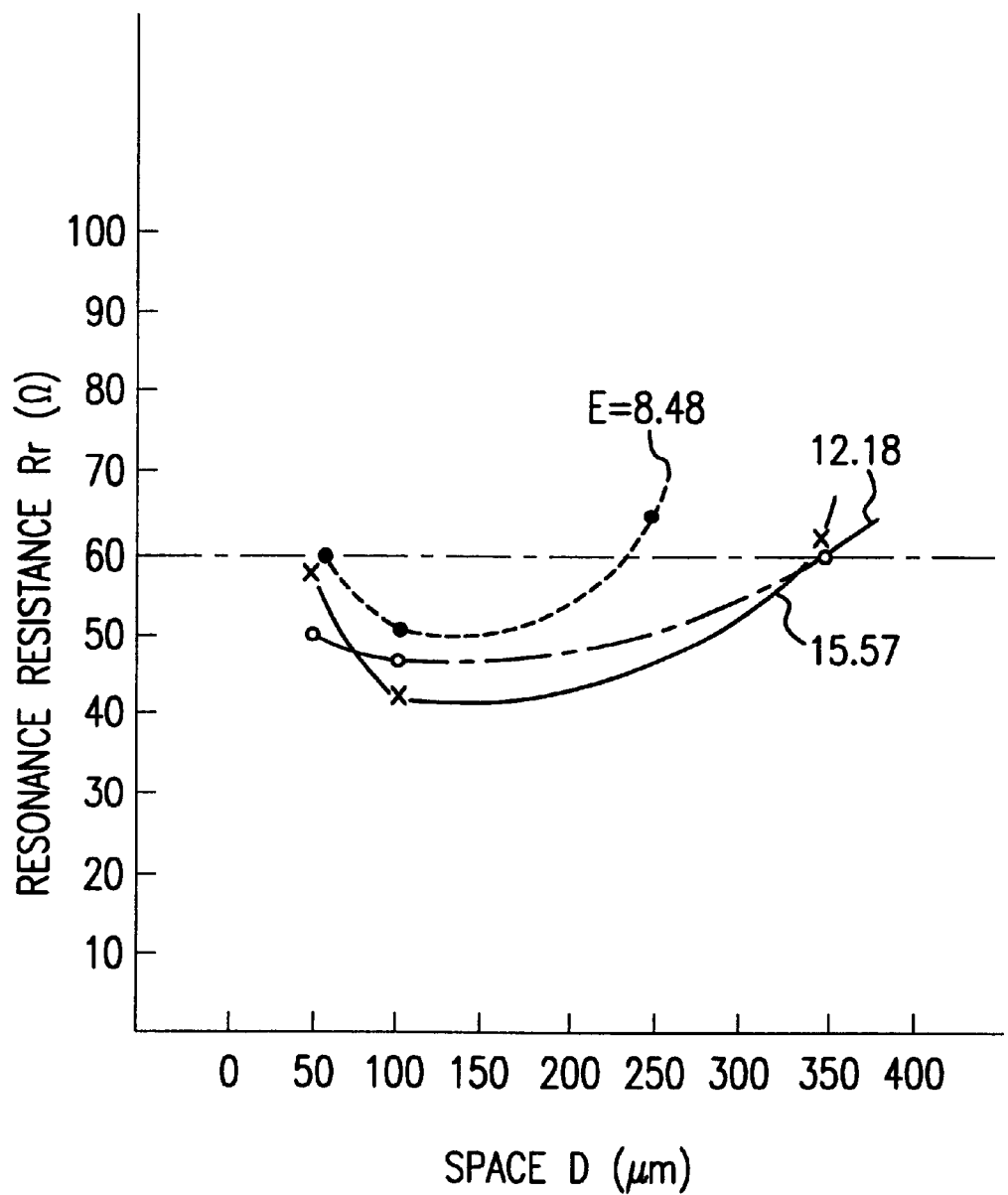
FIG. 27 is a graph illustrating the relationship between the resonance resistance Rr and the space D between the edge of the electrode and the edge of the quartz element.

The maximum resonance resistances Rr, in the temperature range from −20° C. to +80° C. are plotted in FIG. 27 for various spaces D from 50 μm to 350 μm. In the case where the width-to-thickness ratio E is 12.18, if the space D is in the range from 50 μm to 340 μm, it is possible to obtain a small resonance resistance Rr less than 60Ω. However, taking into account the fact that the sample having a space D of 50 μm shows coupling with spurious vibrations in the operating temperature, it is preferable that the space D be in the range from 75 μm to 340 μm.

EXAMPLE 13

Figure 25A:
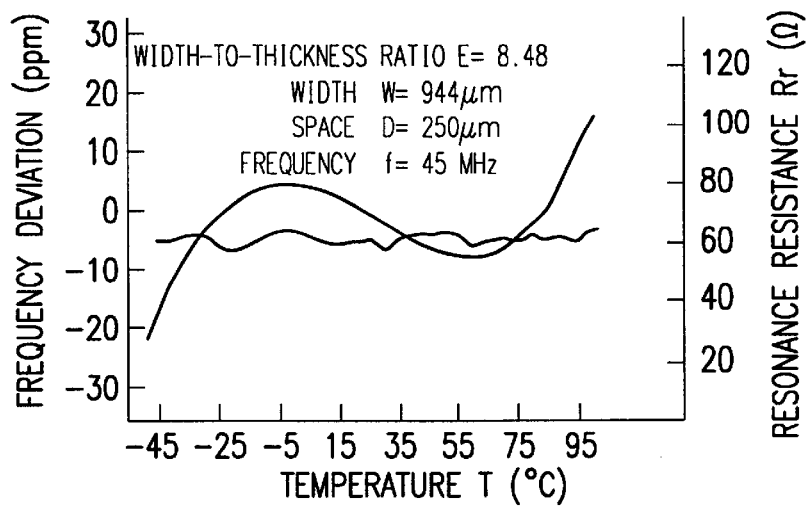
FIG. 25 is a graph illustrating the temperature characteristics of quartz resonator units fabricated using a quartz element having a width-to-thickness ratio E of 8.48, for various spaces D.
Figure 25B:
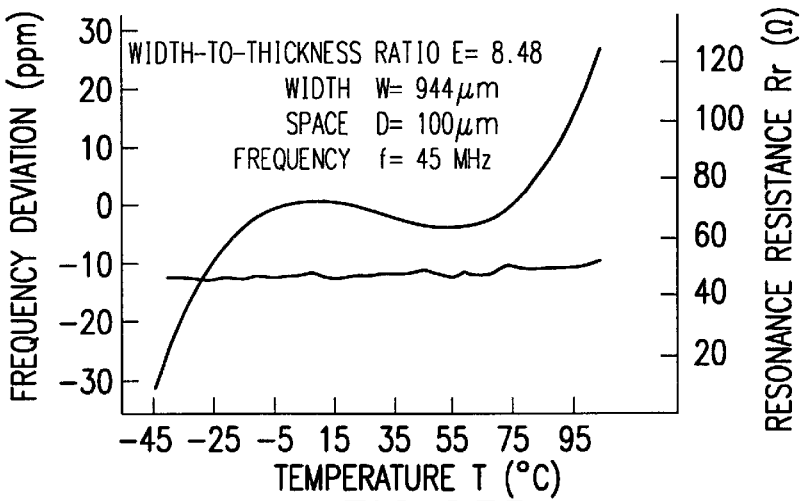

FIG. 25 illustrates the experimental results of quartz elements each fabricated according to the same method as in the above example. However, in this example, each quartz element has a width-to-thickness ratio of 8.48, a width w of 944 μm, and a length l of 4200 μm so that it oscillates at 45.0 MHz. As shown in FIG. 25(b), the sample having a space D of 100 μm exhibits good stability in the frequency-temperature characteristic as well as in the resonance resistance Rr over the entire temperature range. Furthermore, this sample also shows a good resonance resistance Rr as low as 50Ω.

Figure 25C:
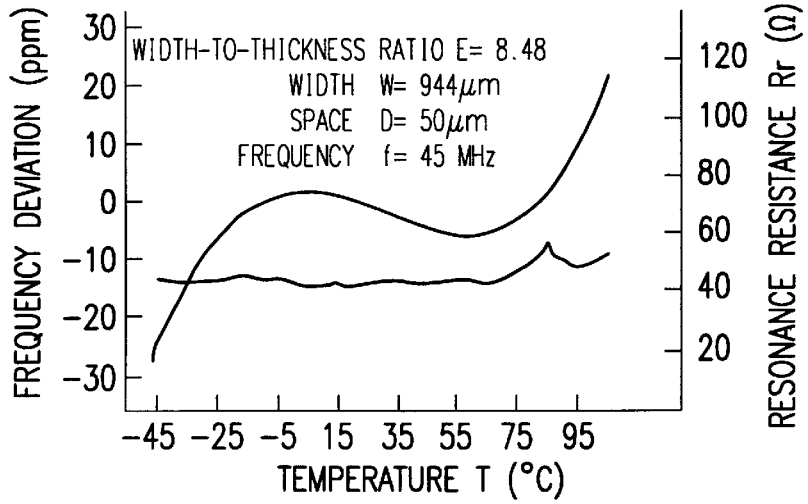

In contrast, the sample having a space D of 250 μm shows instability over the entire temperature range, as illustrated in FIG. 25(a), which is a tendency similar to the previous example. On the other hand, the sample having a space D of 50 μm shows coupling with spurious vibrations at temperatures near 80° C., as illustrated in FIG. 25(c).

The maximum resonance resistances Rr in the temperature range from −20° C. to +80° C. are also plotted in FIG. 27 for various spaces D, from 50 μm to 250 μm. As can be seen from this figure, in the case where the width-to-thickness ratio E is 8.48, if the space D is in the range from 50 μm to 230 μm, it is possible to obtain a small resonance resistance Rr less than 60Ω. However, taking into account the fact that the sample having a space D of 50 μm shows coupling with spurious vibrations in the operating temperature, it is preferable that the space D be in the range from 75 μm to 230 μm.

EXAMPLE 14

Figure 26A:
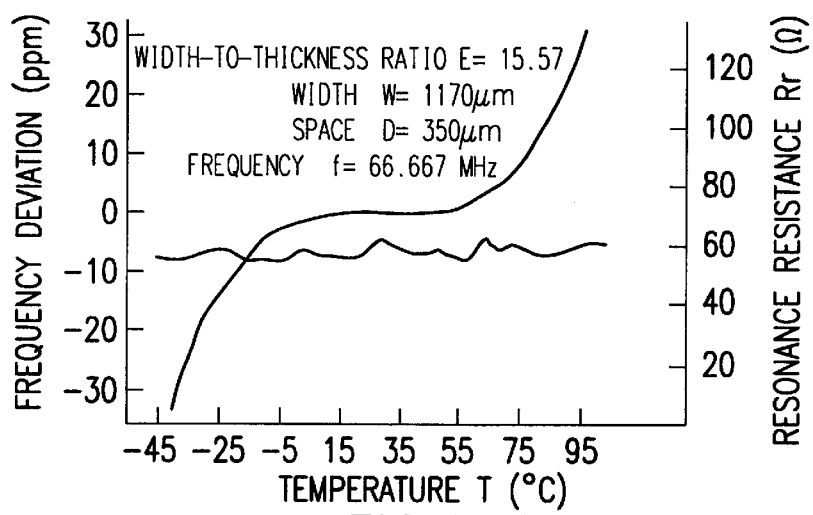
FIG. 26 is a graph illustrating the temperature characteristics of quartz resonator units fabricated using a quartz element having a width-to-thickness ratio E of 15.57, for various spaces D.
Figure 26B:
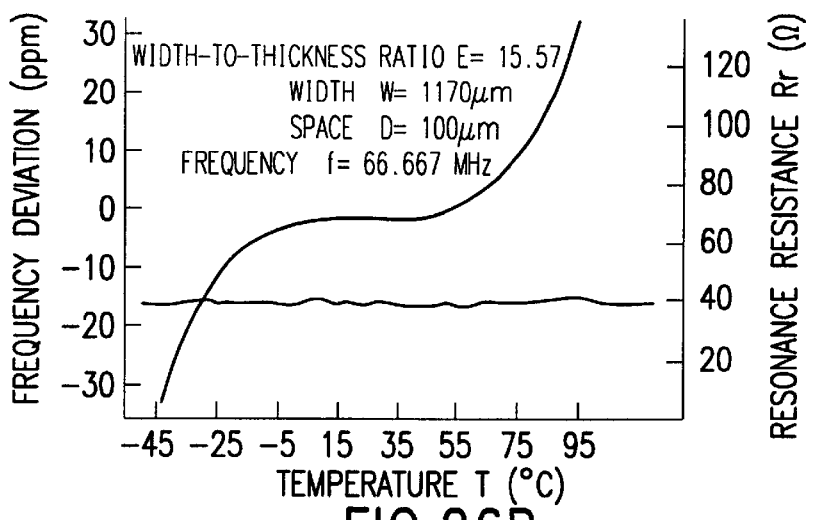

FIG. 26 illustrates the experimental results of quartz elements each fabricated according to the same method as in the previous examples. However, in this example, each quartz element has a width-to-thickness ratio of 15.57, a width w of 1170 μm, and a length l of 4200 μm, so that it oscillates at 66.667 MHz. As shown in FIG. 26(b), the sample having a space D of 100 μm exhibits good stability in the frequency-temperature characteristic as well as in the resonance resistance Rr over the entire temperature range. Furthermore, this sample also shows a good resonance resistance Rr as low as 40Ω.

Figure 26C:
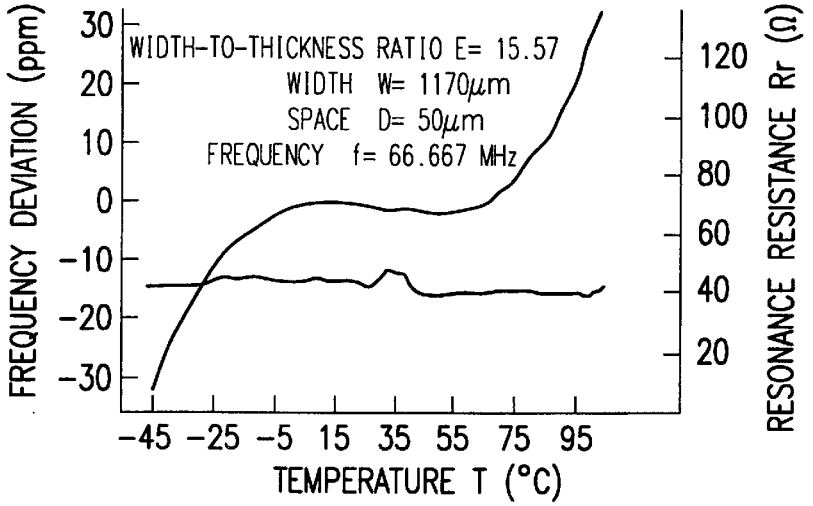

In contrast, the sample having a space D of 350 μm shows instability over the entire temperature range, as illustrated in FIG. 26(a), which is a tendency similar to the previous examples. On the other hand, the sample having a space D of 50 μm shows coupling with spurious vibrations at temperatures near 35° C., as illustrated in FIG. 26(c).

The maximum resonance resistances Rr in the temperature range from −20° C. to +80° C. are also plotted in FIG. 27 for various spaces D, from 50 μm to 350 μm. As can be seen from this figure, in the case where the width-to-thickness ratio E is 15.57, if the space D is in the range from 50 μm to 340 μm, it is possible to obtain a small resonance resistance Rr less than 60Ω. However, taking into account the fact that the sample having a space D of 50 μm shows coupling with spurious vibrations in the operating temperature, it is preferable that the space D be in the range from 75 μm to 340 μm.

As discussed above, if the electrodes are formed on a quartz element such that the space D has a proper value as described above, then it is possible to avoid the effects of spurious vibrations resulting from the edges of the quartz element, and it is also possible to obtain a low resonance resistance Rr. In conclusion, in the case of quartz elements having a width-to-thickness ratio of 8.48 for use in a low frequency range, it is preferable that the space D be in the range from 75 μm to 230 μm. In the case of quartz elements having a width-to-thickness ratio in the range from 12.18 to 15.57, it is preferable that the space D be in the range from 75 μm to 340 μm. Furthermore, if the space D is in the range from 75 μm to 200 μm, then it is possible to produce quartz resonators having high stability in frequency deviation and also having a low resonance resistance for a wide range of width-to-thickness ratios from 8.48, for use in a low frequency range, to 15.57, for use in a high frequency range.

EXAMPLE 15

Figure 28:
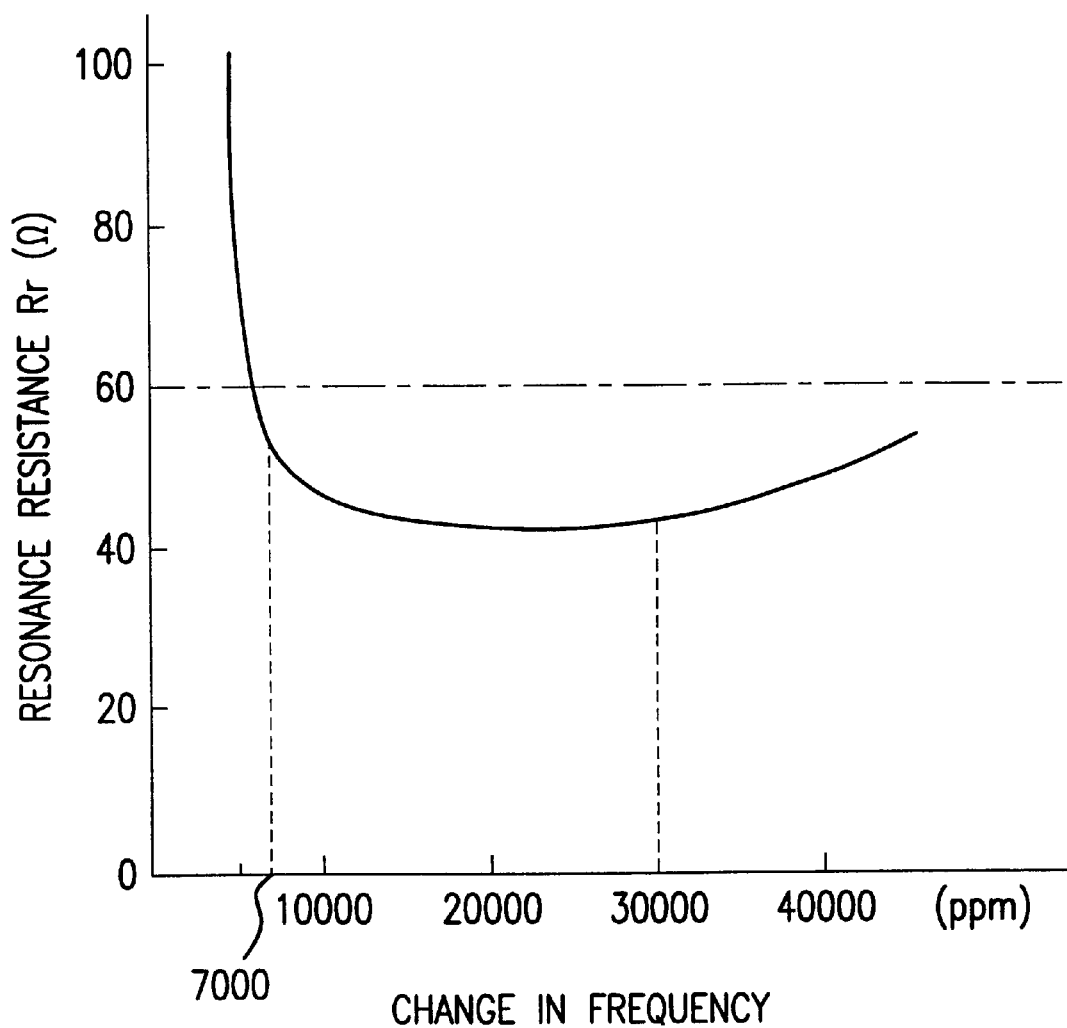
FIG. 28 is a graph illustrating the relationship between the resonance resistance Rr and the change in frequency occurring when an electrode is deposited.

FIG. 28 illustrates the relationship between the resonance resistance Rr and the frequency that changes with the evaporation amount of the electrode material deposited on a quartz element, wherein the quartz element is fabricated according to the above-described method such that it has a width-to-thickness ratio of 12.18, a width w of 1109 μm, and a length l of 4200 μm, so that it oscillates at 55.0 MHz. The change in frequency can be defined by the following equation:

$$\text{Frequency Change} = (f - f')/f \quad (4)$$

where f denotes the frequency for the sample having no evaporated electrodes yet, and f' denotes the frequency for the sample having evaporated electrodes.

As can be seen from FIG. 28, in the range where the frequency change produced by the electrode evaporation is less than 7000 ppm, samples exhibit a very high resonance resistance Rr. In contrast, in the range of frequency change from 7000 ppm to 30000 ppm, the resonance resistance Rr is as low as 50Ω. On the other hand, in the range where the frequency change caused by the electrode evaporation is greater than 30000 ppm, the resonance resistance Rr shows a gradual increase, which means that the characteristics of the quartz resonator units show gradual degradation in this region. In the region where the frequency change is less than 7000 ppm, the resonance resistance Rr becomes high due to insufficient trapping of energy of the vibration in the thickness shear mode. On the other hand, in the range greater than 30000 ppm, the weight of the excitation electrode becomes too large, which interferes with the vibration in the thickness shear mode of the quartz element and thus causes an increase in the resonance resistance Rr.

As can be seen from the above discussion, if the frequency change arising from the electrode evaporation on a quartz element is controlled in the range from 7000 ppm to 30000 ppm, then it is possible to produce a good quartz resonator unit having a low resonance resistance Rr.

As described above, from the experiments and evaluation, the inventor of the present invention has established the method and conditions to produce a quartz resonator unit having a cylinder with a diameter of about 2 mm and a length of about 6 mm that can operate in a wide range of frequencies up to 100 MHz. The quartz element, quartz resonator, and quartz resonator unit produced under the above-described conditions according to the invention have stable temperature characteristics that are essential in the AT-cut quartz resonator unit, and also have a low resonance resistance Rr such as 60Ω over the operation temperature range from −20° C. to +80° C.

Figure 29:
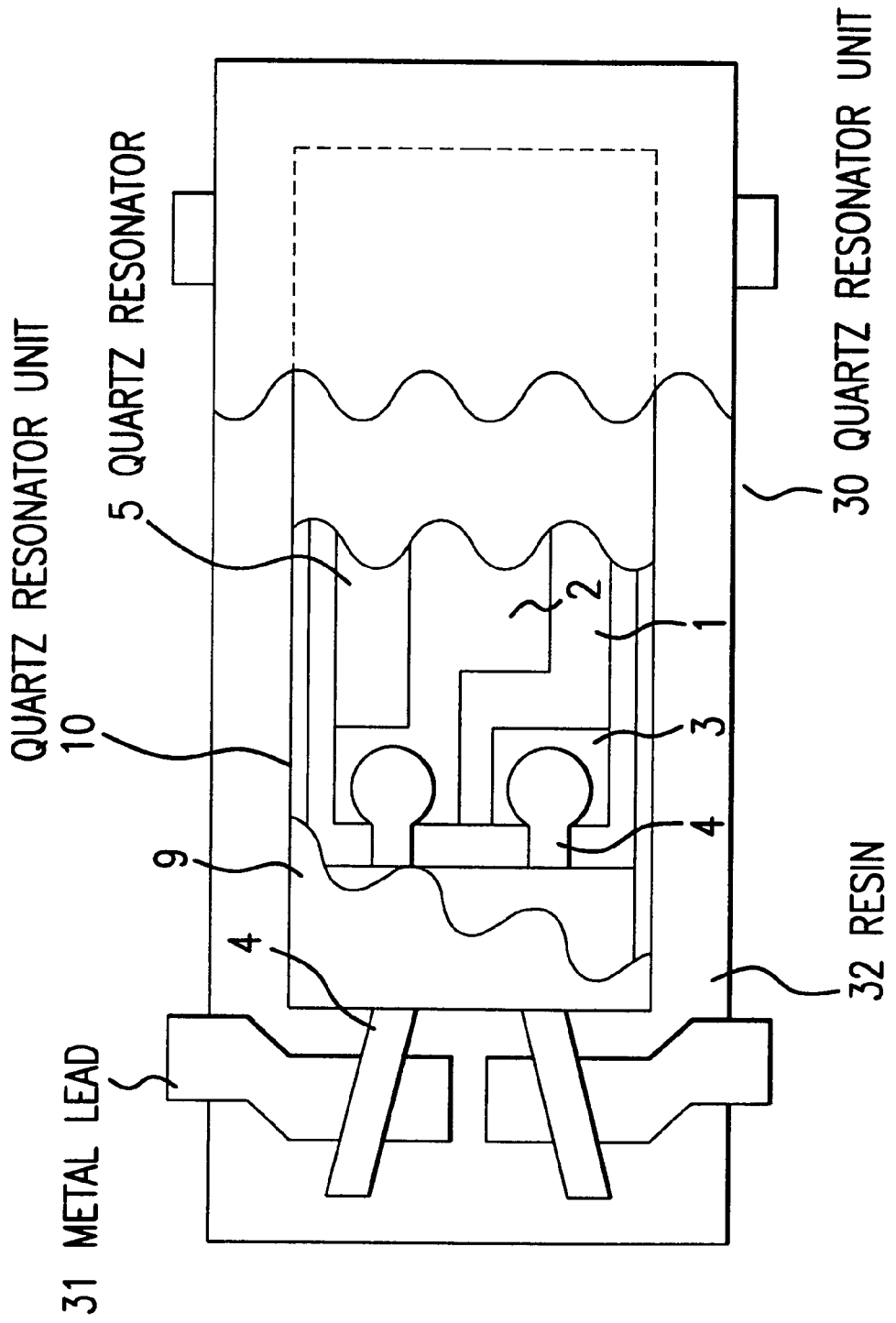
FIG. 29 is a schematic diagram illustrating a quartz resonator unit molded with a resin wherein a part of the quartz resonator is removed for convenience of illustration.

FIG. 29 illustrates a quartz resonator unit 30 fabricated in the form of a surface mounting device wherein the quartz resonator unit 30 includes a quartz resonator unit 10 molded with a resin. The quartz resonator unit 30 is fabricated such that the leads 4 of the quartz resonator unit 10 extending outward via a cylindrical holder 9 are connected to metal leads 31 by means of welding, and these elements are molded with a resin 32. In the quartz resonator unit 30 according to the present embodiment, since the holder 9 is also molded with the resin 32, the quartz resonator unit 30 can be mounted on the surface of a circuit board without using additional elements.

Figure 30:
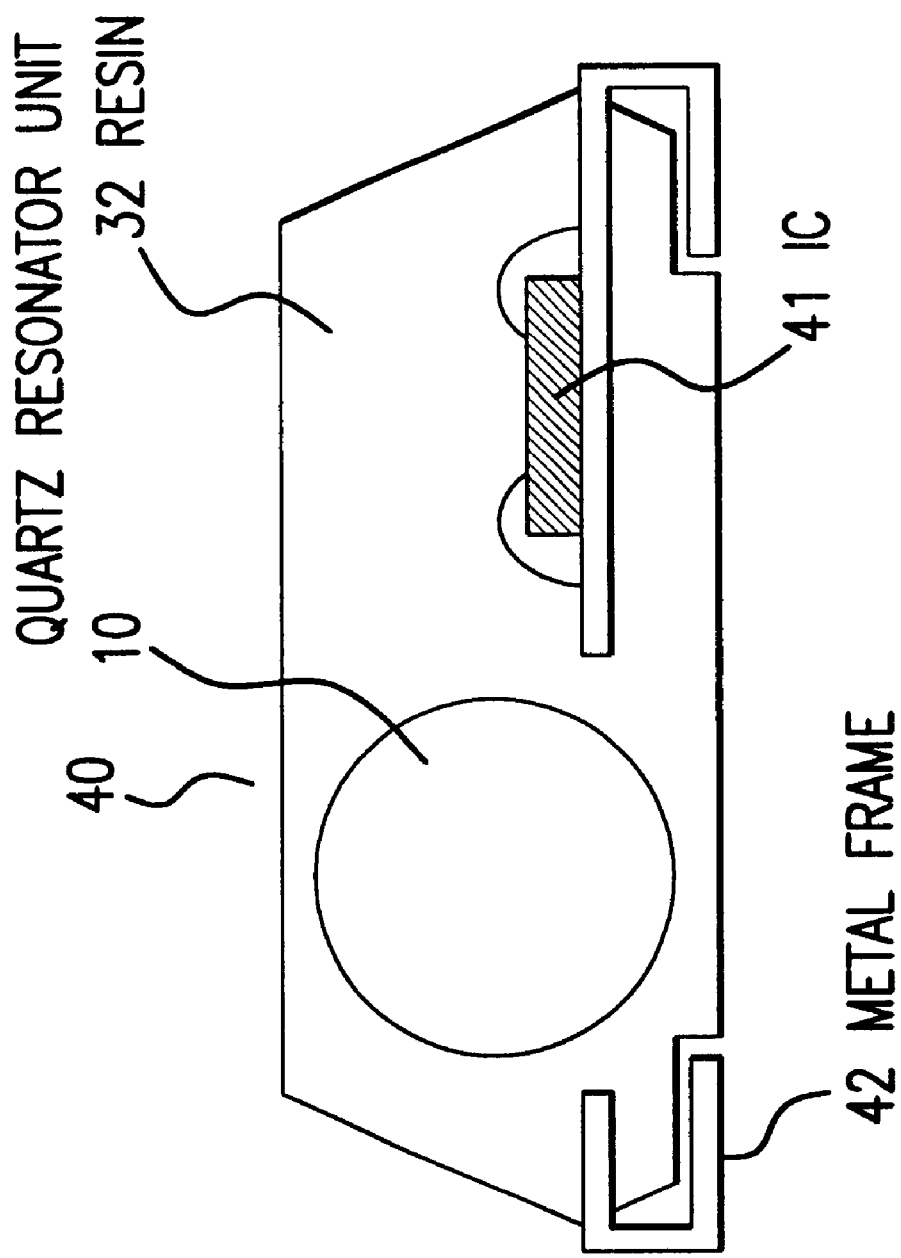
FIG. 30 is a sectional-view of a quartz oscillator including a quartz resonator unit and an IC provided with an oscillation circuit which are molded with a resin.

In an example shown in FIG. 30, a quartz resonator unit 10 according to the present embodiment is combined with an integrated circuit 41, and both are molded with a resin thereby obtaining a quartz oscillator 40. In this quartz oscillator 40, the quartz resonator unit 10 and the integrated circuit 41, including at least an oscillation circuit that oscillates in conjunction with the quartz resonator unit 10 in the third-overtone mode, are mounted on a metal frame 42, and then these are molded with a resin 32. The quartz oscillator 40 can be mounted on a circuit board so that it provides a reference frequency that controls various circuits mounted on the board. Since the diameter of the quartz resonator unit 10 according to the present embodiment is as small as 2.0 mm, the obtained oscillator also has a very small thickness, such as 2.5 mm to 2.7 mm. Furthermore, the quartz resonator unit according to the present embodiment can provide a stable signal at a very high frequency, and thus it can be advantageously used in high-speed electronic systems.

In the present invention, as described above, even when a quartz element is formed into a very small size, since it is produced such that its width-to-thickness ratio has a specific value described above, it can oscillate stably in the third-overtone mode without coupling with spurious vibrations at a very high frequency. Furthermore, in the present invention, there are established various factors to obtain a small resonance resistance with a small variation in the quartz element and quartz resonator fabricated using a rectangular AT-cut quartz element for use in third-overtone oscillation. Thus, the quartz element according to the present invention can be used to obtain a high-frequency quartz resonator unit and quartz oscillator having a small size and a light weight that can be mounted together with ICs in the form of a SMD. Furthermore, in the present invention, there is also disclosed a method for producing such a high-performance quartz element with a high production yield. Thus, the present invention provides a quartz resonator unit and quartz oscillator suitable for use in various electronic equipment and systems, such as communications systems or information processing systems, that are still in quick advancement toward the smaller size, lighter weight, and higher speed.

INDUSTRIAL APPLICABILITY

The quartz element, quartz resonator, quartz resonator unit, and quartz oscillator can be used in various kinds of electronic apparatus and systems including communications systems and information processing systems, particularly as a clock signal source in these electronic systems. In particular, the quartz resonator unit and the quartz oscillator using the quartz resonator unit can provide a small-sized light-weight clock signal source operating at a high frequency, which can be used as SMDs in a small-sized electronic apparatus and systems.

What is claimed is:

1. A rectangular AT-cut quartz element, said rectangular AT-cut quartz element being cut from a single-crystal quartz having the XY'Z'-axis system obtained by rotating the XYZ-orthogonal coordinate system about its X-axis wherein the X-axis is defined by the electrical axis, the Y-axis is defined by a mechanical-axis, and the Z-axis is defined by an optical axis wherein, said rectangular AT-cut quartz element has a thickness t in a direction along said Y'-axis and a width w in a direction along said Z'-axis, and wherein said rectangular AT-cut quartz element has a surface subjected to an etching process, and a maximum height Rmax of a surface roughness is in a range from above 0.2 μm to 0.7 μm.

2. A rectangular AT-cut quartz element according to claim 1, wherein said rectangular AT-cut quartz element has a length l in a direction along said X-axis, and the length l is in a range from 4000 to 4700 μm.

3. A rectangular AT-cut quartz element according to claim 2, wherein said width w is in a range from 800 to 1500 μm.

4. A rectangular AT-cut quartz element according to claim 1, wherein said rectangular AT-cut quartz element has a surface subjected to an etching process, and the maximum height Rmax of the surface roughness is in the range from 0.2 µm to 0.7 µm.

5. A rectangular AT-cut quartz element according to claim 1, wherein the maximum height Rmax of the surface roughness is in a range from about 0.3 µm to about 0.6 µm.

6. A quartz resonator including: a rectangular AT-cut quartz element according to claim 1 wherein said AT-cut quartz element has a width-to-thickness ratio w/t in a range of 8.48+/−0.05; and electrodes deposited on opposing surfaces of said rectangular AT-cut quartz element, said opposing surfaces being separated by a thickness t, wherein a width W of an electrode disposed along the Z'-axis is less than the width w of the rectangular AT-cut quartz element, and spaces between edges of the width W of said electrode and edges of the width w of the rectangular AT-cut quartz element are in a range from about 75 µm to about 230 µm.

7. A quartz resonator according to claim 6, wherein said spaces are in a range from 75 µm to 200 µm.

8. A quartz resonator including: a rectangular AT-cut quartz element according to claim 1, wherein said AT-cut quartz element has a width-to-thickness ratio w/t is in a range selected from a group consisting of 12.18+/−0.05, 13.22+/−0.07, and 15.57+/−0.07; and electrodes deposited on opposing surfaces of said rectangular AT-cut quartz element, said opposing surfaces being separated by said thickness t, wherein a width W of an electrode disposed along the Z'-axis is less than the width w of the rectangular AT-cut quartz element, and spaces between edges of the width W of said electrode and the edges of the width w of the rectangular AT-cut quartz element are in a range from about 75 µm to about 340 µm.

9. A quartz resonator according to claim 8, wherein said spaces are in a range from 75 µm to 200 µm.

10. A quartz resonator including: a rectangular AT-cut quartz element according to claim 6; and electrodes deposited on the opposing surfaces of said rectangular AT-cut quartz element, said opposing surfaces being separated by said thickness t, wherein said deposited electrodes have a thickness in a range corresponding to a change in a range from 7000 ppm to 30000 ppm, in an oscillation frequency of the rectangular AT-cut quartz element having said electrodes relative to a frequency of the rectangular AT-cut quartz element having no electrodes.

11. A quartz resonator unit including: a rectangular AT-cut quartz element according to claim 1; electrodes deposited on two opposing surfaces of said rectangular AT-cut quartz element, said opposing surfaces being separated by said thickness t; and a supporting mechanism for supporting one end of a length along said X-axis of said rectangular AT-cut quartz element, wherein said supporting mechanism includes leads connected to said electrodes via solder or a conductive adhesive.

12. A quartz resonator unit including: a rectangular AT-cut quartz element according to claim 1; and a quartz holder for protecting said rectangular AT-cut quartz element, wherein said quartz holder has a diameter in a range of 2.0 mm+/−0.2 mm, and a length in a range of 6.0 mm+/−0.5 mm.

13. A quartz resonator unit according to claim 12, wherein said width w of said rectangular AT-cut quartz element is in a range from 800 µm to 1500 µm, and said length l in a direction along the X-axis is in a range from 4000 µm to 4700 µm.

14. A quartz resonator unit according to claim 12, wherein said quartz holder is molded with a molding material.

15. A quartz oscillator including: a quartz holder for accommodating a rectangular AT-cut quartz element according to claim 1 thereby protecting it; and an integrated circuit including an oscillation circuit which oscillates said rectangular AT-cut quartz element, wherein said quartz holder and said integrated circuit are molded with a molding material.

16. The rectangular AT-cut quartz element of claim 1, wherein said AT-cut quartz element has a width-to-thickness ratio w/t is in a range of 8.46+/−0.03.

17. The rectangular AT-cut quartz element of claim 1, wherein said AT-cut quartz element has a width-to-thickness ratio w/t is in a range of 8.48+/−0.05.

18. The rectangular AT-cut quartz element of claim 1, wherein said AT-cut quartz element has a width-to-thickness ratio w/t is in a range of 12.18+/−0.05.

19. The rectangular AT-cut quartz element of claim 1, wherein said AT-cut guartz element has a width-to-thickness ratio w/t is in a range of 13.22+/−0.07.

20. The rectangular AT-cut quartz element of claim 1, wherein said AT-cut quartz element has a width-to-thickness ratio w/t is in a range of 15.57+/−0.07.

21. The rectangular AT-cut quartz element of claim 1, wherein the AT-cut quartz element is for vibrating in a resonator at a third overtone.

22. A rectangular AT-cut quartz element operating in a third-overtone resonator without spurious vibrations over a temperature range from about −20° C. to about +80° C., said rectangular AT-cut quartz element being cut from a single-crystal quartz having the XY'Z'-axis system obtained by rotating the XYZ-orthogonal coordinate system about its X-axis wherein the X-axis is defined by an electrical axis, the Y-axis is defined by a mechanical axis, and the Z-axis is defined by an optical axis wherein said rectangular AT-cut quartz element has a thickness t in an direction along the Y'-axis and a width w in a direction along said Z'-axis and said rectangular AT-cut quartz element has a surface subjected to an etching process, and a maximum height Rmax of a surface roughness is from above 0.2 µm to 0.7 µm.

23. The AT-cut quartz element of claim 22, wherein said AT-cut quartz element has a width-to-thickness ratio wit is in a range selected from the group consisting of 8.48+/−0.05, 12.18+/−0.05, 13.22+/−0.07, and 15.57+/−0.07.

24. The AT-cut quartz element according to claim 22, wherein said rectangular AT-cut quartz element has a length l in a direction along the X-axis, and a length l is in a range from 4900 to 4700 µm.

25. AT-cut quartz element according to claim 22, wherein said width w is in a range from 800 to 1500 µm.

26. The AT-cut quartz element according to claim 22, wherein a maximum height Rmax of a surface roughness is in the range from 0.3 µm to 0.6 µm.

27. A quartz resonator including: a rectangular AT-cut quartz element according to claim 22, wherein said AT-cut quartz element has a width-to-thickness ratio wit is in a range of 8.48+/−0.05; and electrodes deposited on opposing surfaces of said rectangular AT-cut quartz element, said opposing surfaces being separated by said thickness t, wherein a width W of an electrode disposed along the Z'-axis is less than a width w of the rectangular AT-cut quartz element, and spaces between edges of the width W of said electrode and edges of the width w of the rectangular AT-cut quartz element are in a range from about 75 µm to about 230 µm.

28. A resonator according to claim 27, wherein said spaces are in a range from 75 µm to 200 µm.

29. A resonator including: a rectangular AT-cut quartz element according to claim 22, wherein electrodes are deposited on opposing surfaces of said rectangular AT-cut quartz element, said opposing surfaces being separated by said thickness t, wherein a width W of an electrode disposed along the Z'-axis is less than a width w of the rectangular AT-cut quartz element, and the spaces between edges of the width W of said electrode and edges of the width w of the rectangular AT-cut quartz element are in a range from about 75 µm to about 340 µm.

30. An AT-cut quartz element according to claim 29, wherein said spaces are in a range from 75 µm to 200 µm.

31. A quartz resonator including: a rectangular AT-cut quartz element according to claim 22; and electrodes deposited on opposing surfaces of said rectangular AT-cut quartz element, said opposing surfaces being separated by said thickness t, wherein said deposited electrodes have a thickness in a range corresponding to a change in the range from 7000 ppm to 30000 ppm, in an oscillation frequency of the rectangular AT-cut quartz element having said electrodes relative to a frequency of the rectangular AT-cut quartz element having no electrodes.

32. A quartz resonator including a rectangular AT-cut quartz element according to claim 22; electrodes deposited on two opposing surfaces of said rectangular AT-cut quartz element, said opposing surfaces being separated by said thickness t; and a supporting mechanism for supporting one end of the length along said X-axis of said rectangular AT-cut quartz element, wherein said supporting mechanism includes leads connected to said electrodes via solder or a conductive adhesive.

33. A rectangular AT-cut quartz element according to claim 22; and a quartz holder for protecting said rectangular AT-cut quartz element, wherein said quartz holder has a diameter in a range of 2.0 mm+/−0.2 mm, and a length in a range of 6.0 mm+/−0.5 mm.

34. A quartz element and holder according to claim 33, wherein said width w of said rectangular AT-cut quartz element is in a range from 800 µm to 1500 µm, and said length l in one direction along the X-axis is in a range from 4000 µm to 4700 µm.

35. A quartz element and holder according to claim 42, wherein said quartz holder is molded with a molding material.

36. A quartz oscillator including a quartz holder for accommodating said rectangular AT-cut quartz element according to claim 22 thereby protecting it; and an integrated circuit including an oscillation circuit which oscillates said rectangular AT-cut quartz element, wherein said quartz holder and said integrated circuit are molded with a molding material.

37. A quartz oscillator according to claim 36, wherein said quartz holder has a diameter in a range of 2.0 mm+/−0.2 mm and a length in a range of 6.0 mm+/−0.5 mm.

38. A quartz oscillator according to claim 36, wherein said width w of said rectangular AT-cut quartz element is in a range from 800 µm to 1500 µm, and said length l in the direction along the X-axis is in a range from 4000 µm to 4700 µm.

39. The quartz oscillator of claim 36, wherein said AT-cut quartz element has a width-to-thickness ratio w/t in a range selected from a group consisting of 8.48+/−0.05, 12.18+/−0.05, 13.22+/−0.07, and 15.57+/−0.07.

40. The quartz oscillator of claim 39, wherein the width-to-thickness ratio w/t is in range of 8.48+/−0.05.

41. A third-overtone resonator for operation without spurious vibrations including a rectangular AT-cut quartz element being cut from a single-crystal quartz having the XY'Z'-axis system obtained by rotating the XYZ-orthogonal coordinate system about its X-axis wherein the X-axis is defined by an electrical axis, the Y-axis is defined by a mechanical axis, and the Z-axis is defined by an optical axis wherein said rectangular AT-cut quartz element has a thickness t in a direction along the Y'-axis and a width w in a direction along said Z'-axis, and wherein a width-to-thickness ratio w/t is in a range selected from a group consisting of 12.18+/−0.05, 13.22+/−0.07, and 15.57+/−0.07 and a maximum height Rmax of a surface roughness of said element is in a range from above 0.2 µm to 0.7 µm.

42. The third overtone resonator of claim 41, wherein the width-to-thickness ratio w/t is in a range of 12.18+/−0.05.

43. The third overtone resonator of claim 41, wherein the width-to-thickness ratio w/t is in a range of 13.22+/−0.07.

44. The third overtone resonator of claim 41, wherein the width-to-thickness ratio w/t is in a range of 15.57+/−0.07.

45. The third overtone resonator of claim 41, wherein said rectangular AT-cut quartz element has a length l in a direction along said X-axis, and the length l is in a range from 4000 to 4700 µm.

46. The third overtone resonator of claim 41, wherein said width w is in a range from 800 to 1500 µm.

47. The third overtone resonator of claim 50, wherein a maximum height Rmax of a surface roughness of said element is in a range from 0.3 µm to 0.6 µm.

48. A quartz resonator including: a third overtone resonator according to claim 41 including electrodes deposited on opposing surfaces of said rectangular AT-cut quartz element, said opposing surfaces being separated by said thickness t, wherein a width W of an electrode disposed along a Z'-axis is less than the width w of the rectangular AT-cut quartz element and spaces between edges of the width W of said electrode and edges of the width w of the rectangular AT-cut quartz element are in a range from about 75 µm to about 230 µm.

49. A quartz resonator according to claim 48, wherein said spaces are in a range from about 75 µm to about 200 µm.

50. A quartz resonator including: a third overtone resonator according to claim 48, wherein said electrodes are deposited on the opposing surfaces of said rectangular AT-cut quartz element, said opposing surfaces being separated by said thickness t, wherein the width W of the electrode disposed along a Z'-axis is less than the width w of the rectangular AT-cut quartz element, and the spaces between edges of the width W of said electrode and edges of the width w of the rectangular AT-cut quartz element are in a range from about 75 µm to about 340 µm.

51. A quartz resonator including: a third overtone resonator according to claim 41; and electrodes deposited on opposing surfaces of said rectangular AT-cut quartz element, said opposing surfaces being separated by said thickness t, wherein said deposited electrodes have a thickness in a range corresponding to a change in a range from 7000 ppm to 30000 ppm, in an oscillation frequency of the rectangular AT-cut quartz element having said electrodes relative to a frequency of the rectangular AT-cut quartz element having no electrodes.

52. A quartz resonator unit including: a third overtone resonator according to claim 50; electrodes deposited on two opposing surfaces of said rectangular AT-cut quartz element, said opposing surfaces being separated by said thickness t; and a supporting mechanism for supporting one end of a length along said X-axis of said rectangular AT-cut quartz element, wherein said supporting mechanism includes leads connected to said electrodes via solder or a conductive adhesive.

53. A quartz resonator unit including: a third overtone resonator according to claim 41; a quartz holder for protecting said rectangular AT-cut quartz element, wherein said quartz holder has a diameter in a range of 2.0 mm+/−0.2 mm, and a length in a range of 6.0 mm+/−0.5 mm.

54. A quartz resonator unit according to claim 53, wherein said width w of said rectangular AT-cut quartz element is in a range from 800 μm to 1500 μm, and a length l in the direction along the X-axis is in a range from 4000 μm to 4700 μm.

55. A quartz resonator unit according to claim 53, wherein said quartz holder is molded with a molding material.

56. A quartz oscillator including: a quartz holder for accommodating a rectangular AT-cut quartz element according to claim 33 thereby protecting it; and an integrated circuit including an oscillation circuit which oscillates said rectangular AT-cut quartz element, wherein said quartz holder and said integrated circuit are molded with a molding material.

57. A quartz oscillator according to claim 56, wherein said quartz holder has a diameter in a range of 2.0 mm+/−0.2 mm and a length in a range of 6.0 mm+/−0.5 mm.

58. A quartz resonator unit according to claim 65, wherein said width w of said rectangular AT-cut quartz element is in a range from 800 μm to 1500 μm, and said length l in the direction along the X-axis is in a range from 4000 μm to 4700 μm.

* * * * *